(12) United States Patent
Kuehnis et al.

(10) Patent No.: US 12,379,769 B2
(45) Date of Patent: *Aug. 5, 2025

(54) SYSTEM, APPARATUS AND METHOD FOR DYNAMIC THERMAL DISTRIBUTION OF A SYSTEM ON CHIP

(71) Applicant: Intel Corporation, Santa Clara, CA (US)

(72) Inventors: Rolf Kuehnis, Portland, OR (US); Matthew Long, Portland, OR (US); Julien Sebot, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 112 days.

This patent is subject to a terminal disclaimer.

(21) Appl. No.: 18/296,560

(22) Filed: Apr. 6, 2023

(65) Prior Publication Data

US 2023/0315192 A1    Oct. 5, 2023

Related U.S. Application Data

(63) Continuation of application No. 16/217,312, filed on Dec. 12, 2018, now Pat. No. 11,656,676.

(51) Int. Cl.
*G06F 1/32* (2019.01)
*G01K 7/02* (2021.01)
*G06F 1/3203* (2019.01)
*G06F 1/3296* (2019.01)
(Continued)

(52) U.S. Cl.
CPC .......... *G06F 1/3296* (2013.01); *G01K 7/021* (2013.01); *G06F 1/3203* (2013.01); *G06F 9/5094* (2013.01); *H03K 17/082* (2013.01); *Y02D 10/00* (2018.01)

(58) Field of Classification Search
CPC .... G06F 1/3296; G06F 1/3203; G06F 9/5094; G06F 1/324; G01K 7/021; H03K 17/082; Y02D 10/00
See application file for complete search history.

(56) References Cited

U.S. PATENT DOCUMENTS

| | | |
|---|---|---|
| 4,675,770 A | 6/1987 | Johansson |
| 5,163,153 A | 11/1992 | Cole et al. |
| 5,522,087 A | 5/1996 | Hsiang |

(Continued)

FOREIGN PATENT DOCUMENTS

| | | |
|---|---|---|
| EP | 1282030 A1 | 2/2003 |
| WO | 2017034795 A1 | 3/2017 |

OTHER PUBLICATIONS

Intel Developer Forum, IDF 2010, Opher Kahn et al., "Intel Next Generation Microarchitecture Codename Sandy Bridge: New Processor Innovations," Sep. 13, 2010, 58 pages.

(Continued)

*Primary Examiner* — Danny Chan
(74) *Attorney, Agent, or Firm* — Schwabe, Williamson & Wyatt, P.C.

(57) ABSTRACT

In one embodiment, a processor includes: a first plurality of intellectual property (IP) circuits to execute operations; and a second plurality of integrated voltage regulators, where the second plurality of integrated voltage regulators are over-subscribed with respect to the first plurality of IP circuits. Other embodiments are described and claimed.

18 Claims, 22 Drawing Sheets

(51) Int. Cl.
*G06F 9/50* (2006.01)
*H03K 17/082* (2006.01)

(56) References Cited

U.S. PATENT DOCUMENTS

| | | | |
|---|---|---|---|
| 5,590,341 A | 12/1996 | Matter | |
| 5,621,250 A | 4/1997 | Kim | |
| 5,931,950 A | 8/1999 | Hsu | |
| 6,285,550 B1* | 9/2001 | Belady | H01L 23/467 |
| | | | 257/714 |
| 6,748,546 B1 | 6/2004 | Mirov et al. | |
| 6,792,392 B1 | 9/2004 | Knight | |
| 6,823,516 B1 | 11/2004 | Cooper | |
| 6,829,713 B2 | 12/2004 | Cooper et al. | |
| 6,996,728 B2 | 2/2006 | Singh | |
| 7,010,708 B2 | 3/2006 | Ma | |
| 7,043,649 B2 | 5/2006 | Terrell, II | |
| 7,093,147 B2 | 8/2006 | Farkas et al. | |
| 7,111,179 B1 | 9/2006 | Girson et al. | |
| 7,194,643 B2 | 3/2007 | Gonzalez et al. | |
| 7,272,730 B1 | 9/2007 | Acquaviva et al. | |
| 7,412,615 B2 | 8/2008 | Yokota et al. | |
| 7,434,073 B2 | 10/2008 | Magklis et al. | |
| 7,437,270 B2 | 10/2008 | Song et al. | |
| 7,454,632 B2 | 11/2008 | Kardach et al. | |
| 7,472,320 B2 | 12/2008 | Berndlmaier et al. | |
| 7,529,956 B2 | 5/2009 | Stufflebeam | |
| 7,539,885 B2 | 5/2009 | Ma | |
| 7,707,528 B1* | 4/2010 | White | G06F 30/367 |
| | | | 716/106 |
| 7,730,340 B2 | 6/2010 | Hu et al. | |
| 8,943,334 B2 | 1/2015 | Kumar et al. | |
| 9,165,537 B2* | 10/2015 | Wyatt | G09G 5/395 |
| 9,588,559 B2 | 3/2017 | Venishetti et al. | |
| 9,941,880 B1* | 4/2018 | Lesea | H03K 19/003 |
| 2001/0044909 A1 | 11/2001 | Oh et al. | |
| 2002/0194509 A1 | 12/2002 | Plante et al. | |
| 2003/0061383 A1 | 3/2003 | Zilka | |
| 2003/0081389 A1* | 5/2003 | Nair | H01L 25/16 |
| | | | 361/764 |
| 2004/0064752 A1 | 4/2004 | Kazachinsky et al. | |
| 2004/0098560 A1 | 5/2004 | Storvik et al. | |
| 2004/0111231 A1 | 6/2004 | Ando | |
| 2004/0139356 A1 | 7/2004 | Ma | |
| 2004/0268166 A1 | 12/2004 | Farkas et al. | |
| 2005/0022038 A1 | 1/2005 | Kaushik et al. | |
| 2005/0033881 A1 | 2/2005 | Yao | |
| 2005/0132238 A1 | 6/2005 | Nanja | |
| 2006/0050670 A1 | 3/2006 | Hillyard et al. | |
| 2006/0053326 A1 | 3/2006 | Naveh et al. | |
| 2006/0059286 A1 | 3/2006 | Bertone et al. | |
| 2006/0069936 A1 | 3/2006 | Lint et al. | |
| 2006/0117202 A1 | 6/2006 | Magklis et al. | |
| 2006/0184287 A1 | 8/2006 | Belady et al. | |
| 2006/0227480 A1* | 10/2006 | Zhou | G06F 1/30 |
| | | | 361/103 |
| 2007/0005995 A1 | 1/2007 | Kardach et al. | |
| 2007/0016817 A1 | 1/2007 | Albonesi et al. | |
| 2007/0075690 A1 | 4/2007 | Chuang et al. | |
| 2007/0079294 A1 | 4/2007 | Knight et al. | |
| 2007/0106827 A1 | 5/2007 | Boatright et al. | |
| 2007/0156992 A1 | 7/2007 | Jahagirdar | |
| 2007/0214342 A1 | 9/2007 | Newburn et al. | |
| 2007/0239398 A1 | 10/2007 | Song et al. | |
| 2007/0245163 A1 | 10/2007 | Lu et al. | |
| 2008/0028240 A1 | 1/2008 | Arai et al. | |
| 2008/0250260 A1 | 10/2008 | Tomita | |
| 2008/0273391 A1* | 11/2008 | Steedman | G11C 5/147 |
| | | | 365/185.33 |
| 2008/0276026 A1 | 11/2008 | Branover et al. | |
| 2009/0006871 A1 | 1/2009 | Liu et al. | |
| 2009/0079492 A1 | 3/2009 | Wu et al. | |
| 2009/0150695 A1 | 6/2009 | Song et al. | |
| 2009/0150696 A1 | 6/2009 | Song et al. | |
| 2009/0158061 A1 | 6/2009 | Schmitz et al. | |
| 2009/0158067 A1 | 6/2009 | Bodas et al. | |
| 2009/0172375 A1 | 7/2009 | Rotem et al. | |
| 2009/0172428 A1 | 7/2009 | Lee | |
| 2009/0235105 A1 | 9/2009 | Branover et al. | |
| 2010/0115309 A1 | 5/2010 | Carvalho et al. | |
| 2010/0146513 A1 | 6/2010 | Song | |
| 2010/0191997 A1 | 7/2010 | Dodeja et al. | |
| 2010/0232248 A1* | 9/2010 | Erickson | G11C 17/18 |
| | | | 365/225.7 |
| 2011/0060928 A1* | 3/2011 | Khodorkovsky | G06F 1/3287 |
| | | | 710/305 |
| 2011/0077794 A1 | 3/2011 | Ahuja et al. | |
| 2011/0154090 A1 | 6/2011 | Dixon et al. | |
| 2011/0228622 A1 | 9/2011 | Coteus et al. | |
| 2012/0054502 A1* | 3/2012 | Chueh | G06F 1/26 |
| | | | 713/300 |
| 2012/0079290 A1 | 3/2012 | Kumar et al. | |
| 2012/0246506 A1 | 9/2012 | Knight | |
| 2012/0324253 A1* | 12/2012 | Gunther | G06F 1/26 |
| | | | 713/300 |
| 2013/0061064 A1 | 3/2013 | Ananthakrishnan et al. | |
| 2013/0080803 A1 | 3/2013 | Ananthakrishnan et al. | |
| 2013/0080804 A1 | 3/2013 | Ananthakrishnan et al. | |
| 2013/0111120 A1 | 5/2013 | Ananthakrishnan et al. | |
| 2013/0111121 A1 | 5/2013 | Ananthakrishnan et al. | |
| 2013/0111226 A1 | 5/2013 | Ananthakrishnan et al. | |
| 2013/0111236 A1 | 5/2013 | Ananthakrishnan et al. | |
| 2013/0346774 A1 | 12/2013 | Bhandaru et al. | |
| 2014/0015505 A1 | 1/2014 | George-Kelso et al. | |
| 2014/0068290 A1 | 3/2014 | Bhandaru et al. | |
| 2014/0195829 A1 | 7/2014 | Bhandaru et al. | |
| 2014/0208141 A1 | 7/2014 | Bhandaru et al. | |
| 2015/0177823 A1* | 6/2015 | Maiyuran | G06F 1/3243 |
| | | | 713/320 |
| 2015/0378385 A1* | 12/2015 | Rana | H03K 3/3562 |
| | | | 327/143 |
| 2016/0179180 A1 | 6/2016 | Gupta et al. | |
| 2017/0177044 A1 | 6/2017 | Limaye | |
| 2017/0308153 A1 | 10/2017 | Chou et al. | |
| 2018/0113502 A1 | 4/2018 | Raja et al. | |
| 2019/0095555 A1 | 3/2019 | Lopez et al. | |
| 2020/0019221 A1 | 1/2020 | Jahagirdar et al. | |
| 2020/0026345 A1* | 1/2020 | Fletcher | G06F 1/3206 |
| 2020/0081512 A1 | 3/2020 | Augustine et al. | |

OTHER PUBLICATIONS

Intel Corporation, "Intel 64 and IA-32 Architectures Software Developer's Manual," vol. 3B: System Programming Guide, Part 2, Apr. 2016, Chapter 14 Power and thermal Management (14.1-14.9.5), 39 pages.

Intel Technology Journal, "Power and Thermal Management in the Intel Core Duo Processor," May 15, 2006, pp. 109-122.

Texas Instruments, "LM2940, LM2990, LM2991, LM309, LM317, LP2951, LP2952, LP2953, LP2954, Linear and Switching Voltage Regulator Fundamental Part 1," 2011, pp. 1-31.

International Searching Authority, International Search Report and Written Opinion dated Feb. 6, 2020 in International Application No. PCT/US2019/056843.

Office Action issued Nov. 1, 2024 for KR Application No. 10-2020-7036918, 13 pages.

Automated Translation of Office Action issued Nov. 1, 2024 for KR Application No. 10-2020-7036918, 13 pages.

* cited by examiner

1100

SYSTEM, APPARATUS AND METHOD FOR DYNAMIC THERMAL DISTRIBUTION OF A SYSTEM ON CHIP

CROSS-REFERENCE TO RELATED APPLICATION

The present application is a continuation of U.S. patent application Ser. No. 16/217,312, filed on Dec. 12, 2018, the content of which is hereby incorporated by reference.

TECHNICAL FIELD

Embodiments relate to powering a processor with internal voltage regulators.

BACKGROUND

In modern processors, power can be supplied from an external power supply such as one or more voltage regulators. Internally to a processor, oftentimes there are one or more integrated voltage regulators to further regulate an incoming voltage and provide it to processing units within the processor. Integrated voltage regulators offer overall system power reduction opportunities by operating a transistor at a lower voltage than is possible with an external voltage regulator due to faster response time and elimination of board/package impedance and inductance. The active power savings at the transistor is a squared of the voltage reduction. However, the voltage reduction is done at a cost of regulator efficiency.

Using an internal regulator and reducing power can translate to performance improvement opportunities. However, concentration of on-die regulators in one place on the die as typically implemented due to inductance locality issues can create localized hot spots. This arrangement can exacerbate hot spots, and in some cases limit the potential gains in performance that integrated regulators promise. In worse case scenarios, peak performance can actually suffer.

DETAILED DESCRIPTION

Figure 1:
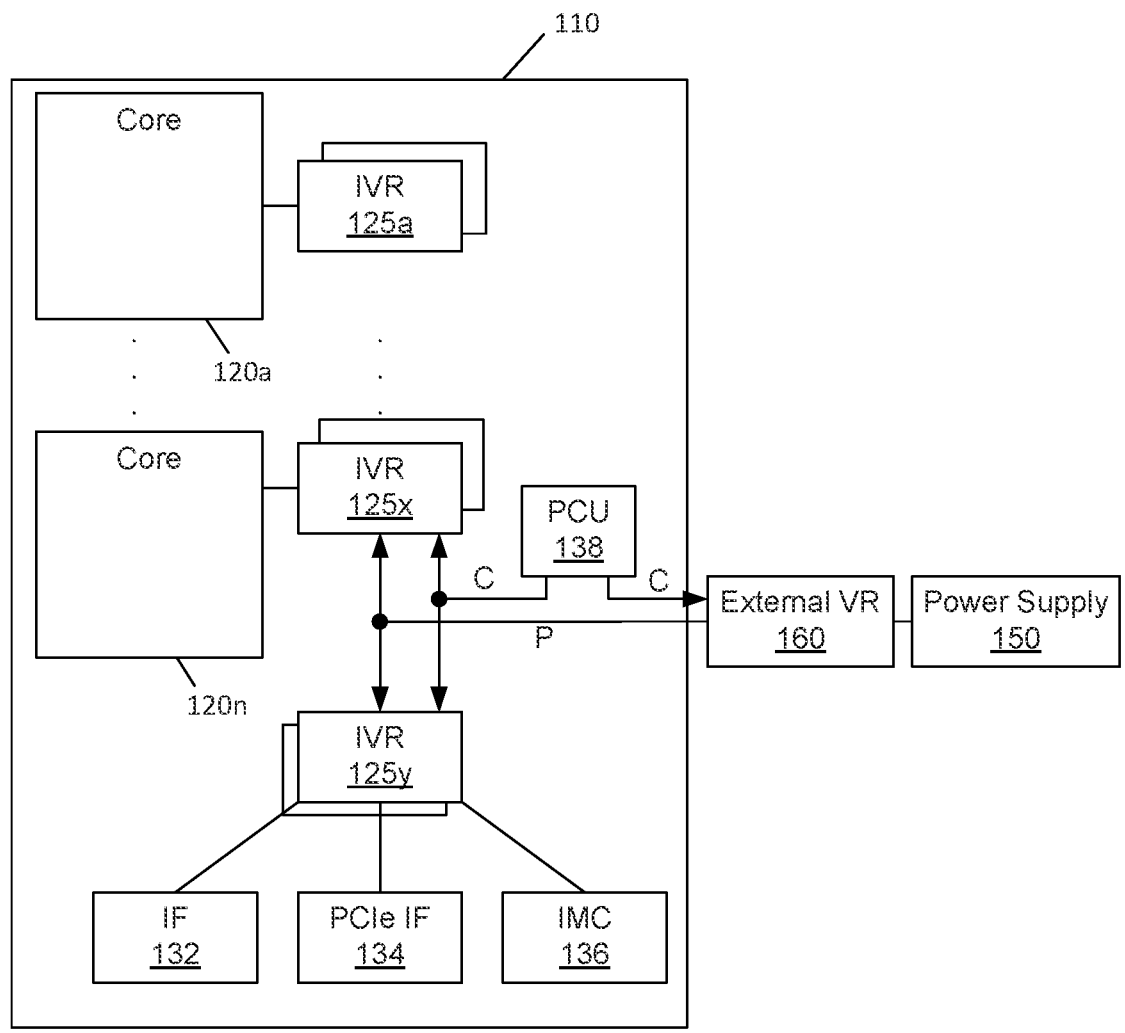
FIG. 1 is a block diagram of a portion of a system in accordance with an embodiment of the present invention.

In various embodiments, a processor or other system on chip (SoC) may be provided with integrated voltage regulators (IVRs) that are controllable, either dynamically or statically, to be enabled or disabled. More specifically, embodiments provide techniques to enable distributed IVR components to be enabled or disabled based on a priori information as to potential hot spots within the processor in cases of a static-based control. Instead, for dynamic-based control actual hot spot information identified during use may be used to dynamically control one or more IVRs or portions thereof to be enabled or disabled.

In some cases, techniques herein may be used to provide power to a given core or other processing unit from a locally located IVR when no thermal condition exists. Instead in the instance of a thermal condition, power can be provided from a more remotely located IVR. In embodiments the IVRs may take the form of low dropout regulators (hereinafter LDOs). In some cases, dynamic control may be used to control a number of power gates of a given LDO to enable to meet power requirements, while at the same time reducing heat dissipation around the location of one or more hot spots. In contrast, many typical IVRs are formed of a switching-type voltage regulator that implements inductors to provide for energy storage. In these typical IVRs, placement issues are exacerbated, as the IVRs are closely coupled with such inductors, which restrict their placement during physical layout. Also with typical IVRs, they are often located in a central location on a die, which can potentially create or exacerbate hot spots.

In contrast, with LDOs as described herein, layout constraints are eased, as the LDOs may be located virtually anywhere on a semiconductor die and may be associated with physically distributed power gates. With an oversubscription of distributed power stages, one or more regulators can be either fused off or dynamically turned off when located close to a hot spot. With embodiments, the thermal hot spots can see the thermal improvement from running at a reduced voltage with minimal impact from the IVR, increasing peak performance as compared to an evenly distributed power distribution solution, and even more significantly as compared to an implementation where the IVRs are concentrated in one location. Note that while embodiments herein address thermal control based on oversubscription and/or selective control of regulators and/or power gates, it is possible also to prioritize enabling of regulators and/or power gates so that these components most closely located near a thermal hot spot may be the last to be enabled and the first to be disabled, in fine grain control situations.

With oversubscription and disabling a portion of regulators, embodiments may resolve concerns with baseline placement of regulators, as many hot spots are scenario dependent (a case for dynamically controlling). In other cases, post-silicon correlation can be used to target the best places to reduce LDO activity (a case for fused disabling). In cases where a constant hot spot is known to exist prior to manufacture, reducing or eliminating one or more LDOs around that area can be accomplished at physical layout. For example, assume that a particular processor type (e.g., a graphics processor) is known to run at high temperatures. In this example, during layout LDOs may be located at more distant regions to the graphics processor in the processor design, or in less extreme cases, some lesser amount of LDOs may be located in close relation to the graphics processor.

In embodiments, LDO output stages may be statically fused to be off or dynamically turned off when associated with a localized hot spot. In one embodiment, such control may be at a high level and at a high granularity in which a processor is segmented into quadrants, where each quadrant may be controlled to operate at a percentage of discrete power gates. In this high level example, depending upon dynamic operating conditions (e.g., activity and/or temperature), 0%, 25%, 50% or 100% (as examples) of the power gates of an output stage of an LDO may be enabled for operation. As such with embodiments, peak performance may be increased in cases where a junction temperature ($T_j$) limits performance. Further for given use cases, embodiments may enable reduced power consumption by way of reducing hot spots. In various embodiments, hot spots may be minimized, as they may be evenly distributed throughout a die by way of the static, dynamic or combination of static and dynamic control of integrated voltage regulators as described herein.

Understand that embodiments provide for a wide variety of techniques and implementations that can be applied on different levels of granularity. In some cases, a processor die may include multiple LDOs that can be controlled on a region basis, e.g., on a quadrant basis. In other cases, greater or lower granularities are possible. For example, in some cases a processor can be segmented into 8, 16 or another number of segments, each having associated LDOs that can be individually controlled. Such individual control includes both enabling or disabling of a given LDO, as well as selective control of a number of power gates of the LDO to enable or disable. Understand that the control mechanisms also may be applied at different granularities. In some cases, a processor-wide power controller (such as a power control unit (PCU)) may be the primary agent responsible for the location-selective voltage regulator control described herein, e.g., based at least in part on thermal information obtained from sensors located throughout a processor. In other cases, the PCU may act in concert with additional power management agents, such as individual core-included power management agents that may control location-selective voltage regulator operations on a per core (or even smaller granularity) basis.

Although the following embodiments are described with reference to energy conservation and energy efficiency in specific integrated circuits, such as in computing platforms or processors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to any particular type of computer systems. That is, disclosed embodiments can be used in many different system types, ranging from server computers (e.g., tower, rack, blade, micro-server and so forth), communications systems, storage systems, desktop computers of any configuration, laptop, notebook, and tablet computers (including 2:1 tablets, phablets and so forth), and may be also used in other devices, such as handheld devices, systems on chip (SoCs), and embedded applications. Some examples of handheld devices include cellular phones such as smartphones, Internet protocol devices, digital cameras, personal digital assistants (PDAs), and handheld PCs. Embedded applications may typically include a microcontroller, a digital signal processor (DSP), network computers (NetPC), set-top boxes, network hubs, wide area network (WAN) switches, wearable devices, or any other system that can perform the functions and operations taught below. More so, embodiments may be implemented in mobile terminals having standard voice functionality such as mobile phones, smartphones and phablets, and/or in non-mobile terminals without a standard wireless voice function communication capability, such as many wearables, tablets, notebooks, desktops, micro-servers, servers and so forth. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future, such as for power conservation and energy efficiency in products that encompass a large portion of the US economy.

Referring now to FIG. 1, shown is a block diagram of a portion of a system in accordance with an embodiment of the present invention. As shown in FIG. 1, system 100 may include various components, including a processor 110 which as shown is a multicore processor. Processor 110 may be coupled to a power supply 150 via an external voltage regulator 160, which may perform a first voltage conversion to provide a primary regulated voltage to processor 110.

As seen, processor 110 may be a single die processor including multiple cores 120$_a$-120$_n$. In addition, each core may be associated with at least one and potentially multiple integrated voltage regulators (IVR) 125$_a$-125$_x$, each of which receives the primary regulated voltage and generates an operating voltage to be provided to one or more agents of the processor associated with the IVR. Accordingly, an IVR implementation may be provided to allow for fine-grained control of voltage and thus power and performance of each individual core. As such, each core can operate at an independent voltage and frequency, enabling great flexibility and affording wide opportunities for balancing power consumption with performance. As described herein, a controllable amount of IVRs 125 (which in an embodiment may be implemented as low dropout regulators (LDOs)) (and/or power gates thereof) may be enabled, based at least in part on thermal information such that dynamic thermal distribution within processor 110 may occur, as described more fully herein.

Still referring to FIG. 1, additional components may be present within the processor including an input/output interface 132, another interface 134, and an integrated memory controller 136. As seen, each of these components may be powered by one or more other integrated voltage regulators $125_y$. In one embodiment, interface 132 may be enable operation for an Intel® Quick Path Interconnect (QPI) interconnect, which provides for point-to-point (PtP) links in a cache coherent protocol that includes multiple layers including a physical layer, a link layer and a protocol layer. In turn, interface 134 may communicate via a Peripheral Component Interconnect Express (PCIe™) protocol.

Also shown is a power control unit (PCU) 138, which may include hardware, software and/or firmware to perform power management operations with regard to processor 110. As seen, PCU 138 provides control information to external voltage regulator 160 via a digital interface to cause the voltage regulator to generate the appropriate regulated voltage. PCU 138 also provides control information to IVRs 125 via another digital interface to control the operating voltage generated (or to cause a corresponding IVR to be disabled in a low power mode). In various embodiments, PCU 138 may include a variety of power management logic units to perform hardware-based power management. Such power management may be wholly processor controlled (e.g., by various processor hardware, and which may be triggered by workload and/or power, thermal or other processor constraints) and/or the power management may be performed responsive to external sources (such as a platform or management power management source or system software).

Furthermore, while FIG. 1 shows an implementation in which PCU 138 is a separate processing engine (which may be implemented as a microcontroller), understand that in some cases in addition to or instead of a dedicated power controller, each core may include or be associated with a power control agent to more autonomously control power consumption independently. In some cases a hierarchical power management architecture may be provided, with PCU 138 in communication with corresponding power management agents associated with each of cores 120.

One power management logic unit included in PCU 138 may be a location selective regulator controller, which may be used to control independent enabling and disabling of IVRs 125, either completely or selectively controlling a number of power gates of a given regulator to enable or disable.

While not shown for ease of illustration, understand that additional components may be present within processor 110 such as additional control circuitry, and other components such as internal memories, e.g., one or more levels of a cache memory hierarchy and so forth. Furthermore, while shown in the implementation of FIG. 1 with an integrated voltage regulator, embodiments are not so limited.

Note that the power management techniques described herein may be independent of and complementary to an operating system (OS)-based power management (OSPM) mechanism. According to one example OSPM technique, a processor can operate at various performance states or levels, so-called P-states, namely from P0 to PN. In general, the P1 performance state may correspond to the highest guaranteed performance state that can be requested by an OS. Embodiments described herein may enable dynamic changes to the guaranteed frequency of the P1 performance state, based on a variety of inputs and processor operating parameters. In addition to this P1 state, the OS can further request a higher performance state, namely a P0 state. This P0 state may thus be an opportunistic or turbo mode state in which, when power and/or thermal budget is available, processor hardware can configure the processor or at least portions thereof to operate at a higher than guaranteed frequency. In many implementations a processor can include multiple so-called bin frequencies above the P1 guaranteed maximum frequency, exceeding to a maximum peak frequency of the particular processor, as fused or otherwise written into the processor during manufacture. In addition, according to one OSPM mechanism, a processor can operate at various power states or levels. With regard to power states, an OSPM mechanism may specify different power consumption states, generally referred to as C-states, C0, C1 to Cn states. When a core is active, it runs at a C0 state, and when the core is idle it may be placed in a core low power state, also called a core non-zero C-state (e.g., C1-C6 states), with each C-state being at a lower power consumption level (such that C6 is a deeper low power state than C1, and so forth).

Understand that many different types of power management techniques may be used individually or in combination in different embodiments. As representative examples, a power controller may control the processor to be power managed by some form of dynamic voltage frequency scaling (DVFS) in which an operating voltage and/or operating frequency of one or more cores or other processor logic may be dynamically controlled to reduce power consumption in certain situations. In an example, DVFS may be performed using Enhanced Intel SpeedStep™ technology available from Intel Corporation, Santa Clara, Calif., to provide optimal performance at a lowest power consumption level. In another example, DVFS may be performed using Intel TurboBoost™ technology to enable one or more cores or other compute engines to operate at a higher than guaranteed operating frequency based on conditions (e.g., workload and availability).

Another power management technique that may be used in certain examples is dynamic swapping of workloads between different compute engines. For example, the processor may include asymmetric cores or other processing engines that operate at different power consumption levels, such that in a power constrained situation, one or more workloads can be dynamically switched to execute on a lower power core or other compute engine. Another exemplary power management technique is hardware duty cycling (HDC), which may cause cores and/or other compute engines to be periodically enabled and disabled according to a duty cycle, such that one or more cores may be made inactive during an inactive period of the duty cycle and made active during an active period of the duty cycle. Although described with these particular examples, understand that many other power management techniques may be used in particular embodiments.

Figure 2:
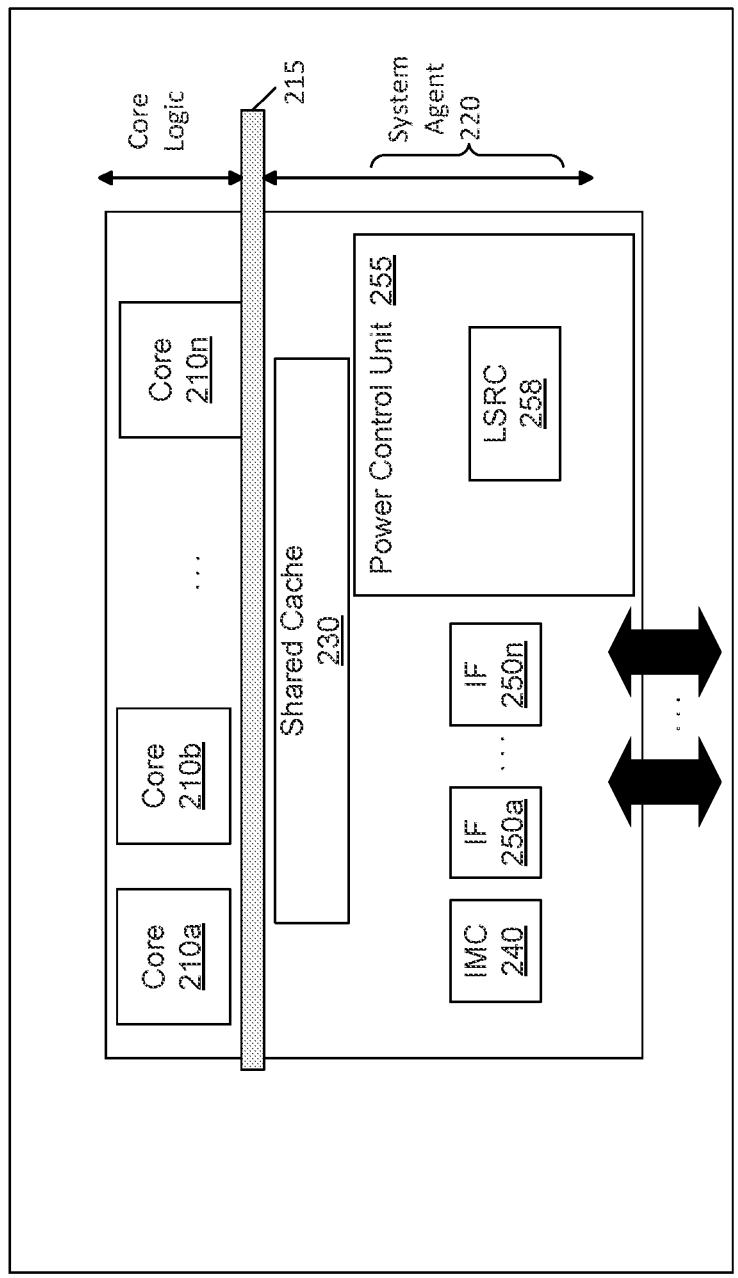
FIG. 2 is a block diagram of a processor in accordance with an embodiment of the present invention.

Embodiments can be implemented in processors for various markets including server processors, desktop processors, mobile processors and so forth. Referring now to FIG. 2, shown is a block diagram of a processor in accordance with an embodiment of the present invention. As shown in FIG. 2, processor 200 may be a multicore processor including a plurality of cores $210_a$-$210_n$. In one embodiment, each such core may be of an independent power domain and can be configured to enter and exit active states and/or maximum performance states based on workload. The various cores may be coupled via an interconnect 215 to a system agent 220 that includes various components. As seen, system agent 220 may include a shared cache 230 which may be a last level cache. In addition, the system agent may include an integrated memory controller 240 to communicate with a system memory (not shown in FIG. 2), e.g., via a memory bus. System agent 220 also includes various interfaces 250 and a power control unit 255, which may include logic to perform the power management techniques described herein. In the embodiment shown, power control unit 255 includes a location selective regulator controller 258 that may, statically or dynamically, control powering of cores 210 and other components of processor 200 in a location selective manner, as described herein.

In addition, by interfaces 250a-250n, connection can be made to various off-chip components such as peripheral devices, mass storage and so forth. While shown with this particular implementation in the embodiment of FIG. 2, the scope of the present invention is not limited in this regard.

Figure 3:
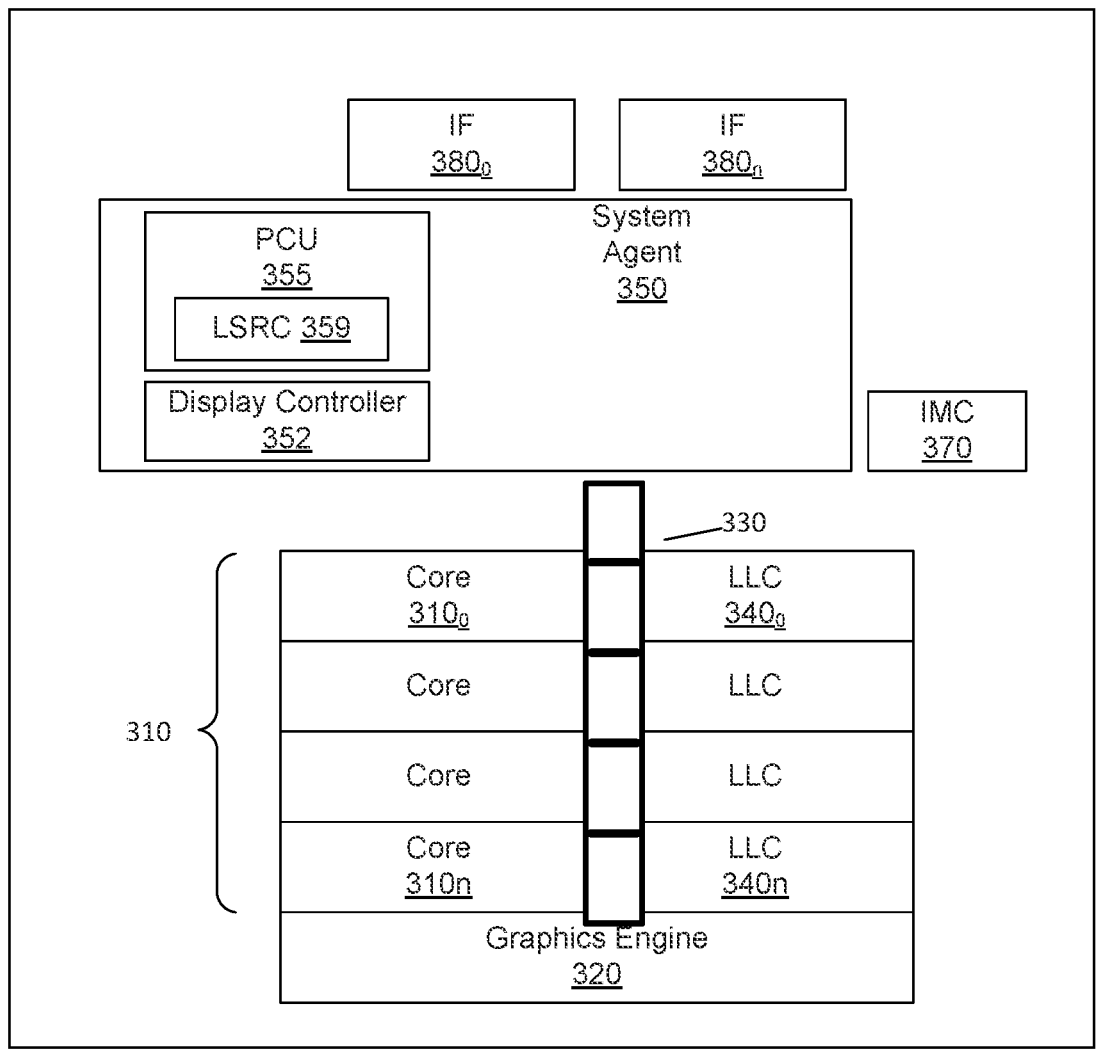
FIG. 3 is a block diagram of a multi-domain processor in accordance with another embodiment of the present invention.

Referring now to FIG. 3, shown is a block diagram of a multi-domain processor in accordance with another embodiment of the present invention. As shown in the embodiment of FIG. 3, processor 300 includes multiple domains. Specifically, a core domain 310 can include a plurality of cores $310_0$-$310_n$, a graphics domain 320 can include one or more graphics engines, and a system agent domain 350 may further be present. In some embodiments, system agent domain 350 may execute at an independent frequency than the core domain and may remain powered on at all times to handle power control events and power management such that domains 310 and 320 can be controlled to dynamically enter into and exit high power and low power states. Each of domains 310 and 320 may operate at different voltage and/or power. Note that while only shown with three domains, understand the scope of the present invention is not limited in this regard and additional domains can be present in other embodiments. For example, multiple core domains may be present each including at least one core.

In general, each core 310 may further include low level caches in addition to various execution units and additional processing elements. In turn, the various cores may be coupled to each other and to a shared cache memory formed of a plurality of units of a last level cache (LLC) $340_0$-$340_n$. In various embodiments, LLC 340 may be shared amongst the cores and the graphics engine, as well as various media processing circuitry. As seen, a ring interconnect 330 thus couples the cores together, and provides interconnection between the cores, graphics domain 320 and system agent circuitry 350. In one embodiment, interconnect 330 can be part of the core domain. However in other embodiments the ring interconnect can be of its own domain.

As further seen, system agent domain 350 may include display controller 352 which may provide control of and an interface to an associated display. As further seen, system agent domain 350 may include a power control unit 355 which can include logic to perform the power management techniques described herein. In the embodiment shown, power control unit 355 includes a location selective regulator controller (LSRC) 359 that may, statically or dynamically, control powering of cores 310 and other components of processor 300 in a location selective manner, as described herein.

As further seen in FIG. 3, processor 300 can further include an integrated memory controller (IMC) 370 that can provide for an interface to a system memory, such as a dynamic random access memory (DRAM). Multiple interfaces $380_0$-$380_n$ may be present to enable interconnection between the processor and other circuitry. For example, in one embodiment at least one direct media interface (DMI) interface may be provided as well as one or more PCIe™ interfaces. Still further, to provide for communications between other agents such as additional processors or other circuitry, one or more QPI interfaces may also be provided. Although shown at this high level in the embodiment of FIG. 3, understand the scope of the present invention is not limited in this regard.

Figure 4:
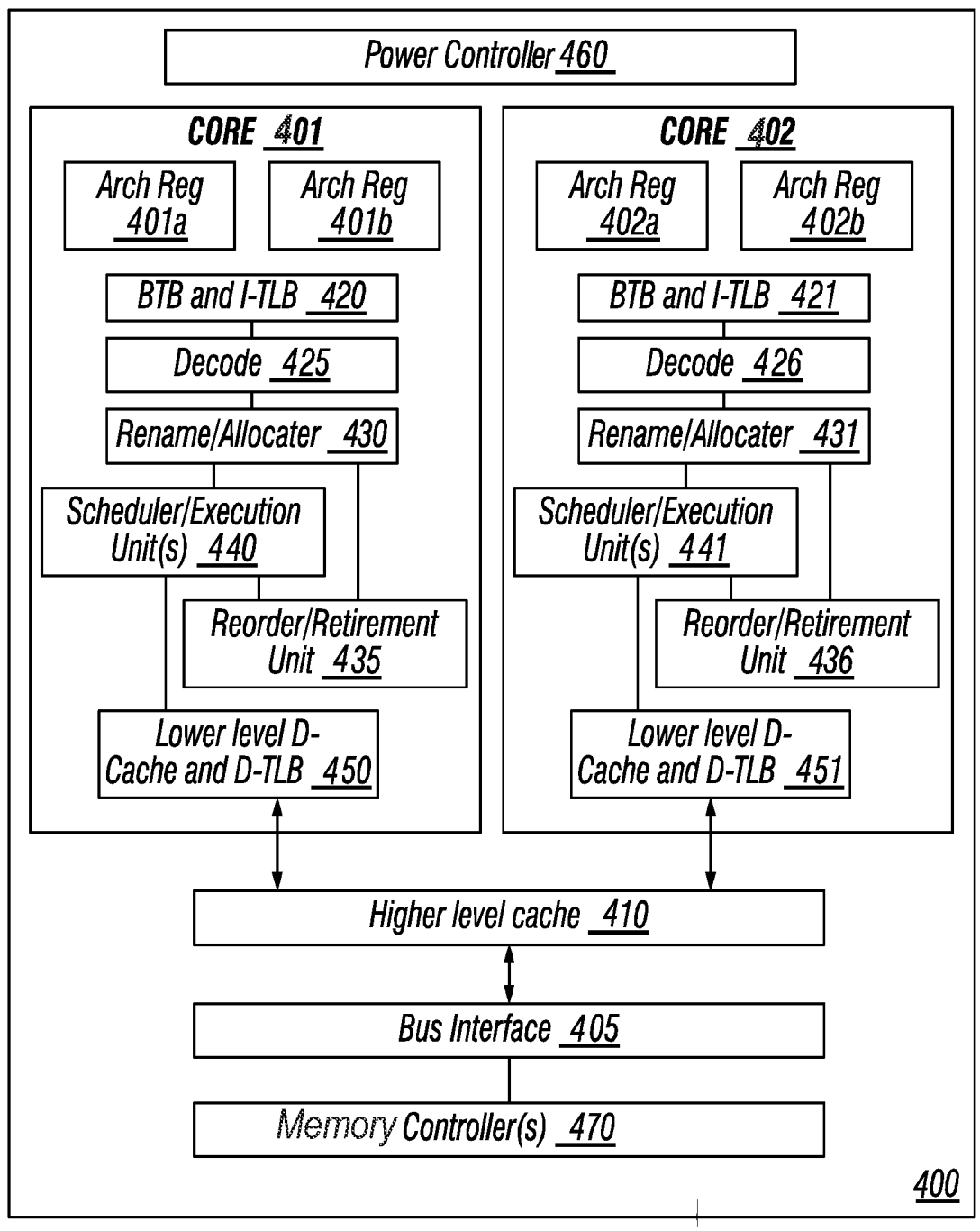
FIG. 4 is an embodiment of a processor including multiple cores.

Referring to FIG. 4, an embodiment of a processor including multiple cores is illustrated. Processor 400 includes any processor or processing device, such as a microprocessor, an embedded processor, a digital signal processor (DSP), a network processor, a handheld processor, an application processor, a co-processor, a system on a chip (SoC), or other device to execute code. Processor 400, in one embodiment, includes at least two cores—cores 401 and 402, which may include asymmetric cores or symmetric cores (the illustrated embodiment). However, processor 400 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 400, as illustrated in FIG. 4, includes two cores, cores 401 and 402. Here, cores 401 and 402 are considered symmetric cores, i.e., cores with the same configurations, functional units, and/or logic. In another embodiment, core 401 includes an out-of-order processor core, while core 402 includes an in-order processor core. However, cores 401 and 402 may be individually selected from any type of core, such as a native core, a software managed core, a core adapted to execute a native instruction set architecture (ISA), a core adapted to execute a translated ISA, a co-designed core, or other known core. Yet to further the discussion, the functional units illustrated in core 401 are described in further detail below, as the units in core 402 operate in a similar manner.

As depicted, core 401 includes two hardware threads 401a and 401b, which may also be referred to as hardware thread slots 401a and 401b. Therefore, software entities, such as an operating system, in one embodiment potentially view processor 400 as four separate processors, i.e., four logical processors or processing elements capable of executing four software threads concurrently. As alluded to above, a first thread is associated with architecture state registers

401a, a second thread is associated with architecture state registers 401b, a third thread may be associated with architecture state registers 402a, and a fourth thread may be associated with architecture state registers 402b. Here, each of the architecture state registers (401a, 401b, 402a, and 402b) may be referred to as processing elements, thread slots, or thread units, as described above. As illustrated, architecture state registers 401a are replicated in architecture state registers 401b, so individual architecture states/contexts are capable of being stored for logical processor 401a and logical processor 401b. In core 401, other smaller resources, such as instruction pointers and renaming logic in allocator and renamer block 430 may also be replicated for threads 401a and 401b. Some resources, such as re-order buffers in reorder/retirement unit 435, ILTB 420, load/store buffers, and queues may be shared through partitioning. Other resources, such as general purpose internal registers, page-table base register(s), low-level data-cache and data-TLB 415, execution unit(s) 440, and portions of out-of-order unit 435 are potentially fully shared.

Processor 400 often includes other resources, which may be fully shared, shared through partitioning, or dedicated by/to processing elements. In FIG. 4, an embodiment of a purely exemplary processor with illustrative logical units/resources of a processor is illustrated. Note that a processor may include, or omit, any of these functional units, as well as include any other known functional units, logic, or firmware not depicted. As illustrated, core 401 includes a simplified, representative out-of-order (OOO) processor core. But an in-order processor may be utilized in different embodiments. The OOO core includes a branch target buffer 420 to predict branches to be executed/taken and an instruction-translation buffer (I-TLB) 420 to store address translation entries for instructions.

Core 401 further includes decode module 425 coupled to fetch unit 420 to decode fetched elements. Fetch logic, in one embodiment, includes individual sequencers associated with thread slots 401a, 401b, respectively. Usually core 401 is associated with a first ISA, which defines/specifies instructions executable on processor 400. Often machine code instructions that are part of the first ISA include a portion of the instruction (referred to as an opcode), which references/specifies an instruction or operation to be performed. Decode logic 425 includes circuitry that recognizes these instructions from their opcodes and passes the decoded instructions on in the pipeline for processing as defined by the first ISA. For example, decoders 425, in one embodiment, include logic designed or adapted to recognize specific instructions, such as transactional instruction. As a result of the recognition by decoders 425, the architecture or core 401 takes specific, predefined actions to perform tasks associated with the appropriate instruction. It is important to note that any of the tasks, blocks, operations, and methods described herein may be performed in response to a single or multiple instructions; some of which may be new or old instructions.

In one example, allocator and renamer block 430 includes an allocator to reserve resources, such as register files to store instruction processing results. However, threads 401a and 401b are potentially capable of out-of-order execution, where allocator and renamer block 430 also reserves other resources, such as reorder buffers to track instruction results. Unit 430 may also include a register renamer to rename program/instruction reference registers to other registers internal to processor 400. Reorder/retirement unit 435 includes components, such as the reorder buffers mentioned above, load buffers, and store buffers, to support out-of-order execution and later in-order retirement of instructions executed out-of-order.

Scheduler and execution unit(s) block 440, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 450 are coupled to execution unit(s) 440. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 401 and 402 share access to higher-level or further-out cache 410, which is to cache recently fetched elements. Note that higher-level or further-out refers to cache levels increasing or getting further away from the execution unit(s). In one embodiment, higher-level cache 410 is a last-level data cache—last cache in the memory hierarchy on processor 400—such as a second or third level data cache. However, higher level cache 410 is not so limited, as it may be associated with or includes an instruction cache. A trace cache—a type of instruction cache—instead may be coupled after decoder 425 to store recently decoded traces.

In the depicted configuration, processor 400 also includes bus interface module 405 and a power controller 460, which may perform power management in accordance with an embodiment of the present invention. In this scenario, bus interface 405 is to communicate with devices external to processor 400, such as system memory and other components.

A memory controller 470 may interface with other devices such as one or many memories. In an example, bus interface 405 includes a ring interconnect with a memory controller for interfacing with a memory and a graphics controller for interfacing with a graphics processor. In an SoC environment, even more devices, such as a network interface, coprocessors, memory, graphics processor, and any other known computer devices/interface may be integrated on a single die or integrated circuit to provide small form factor with high functionality and low power consumption.

Figure 5:
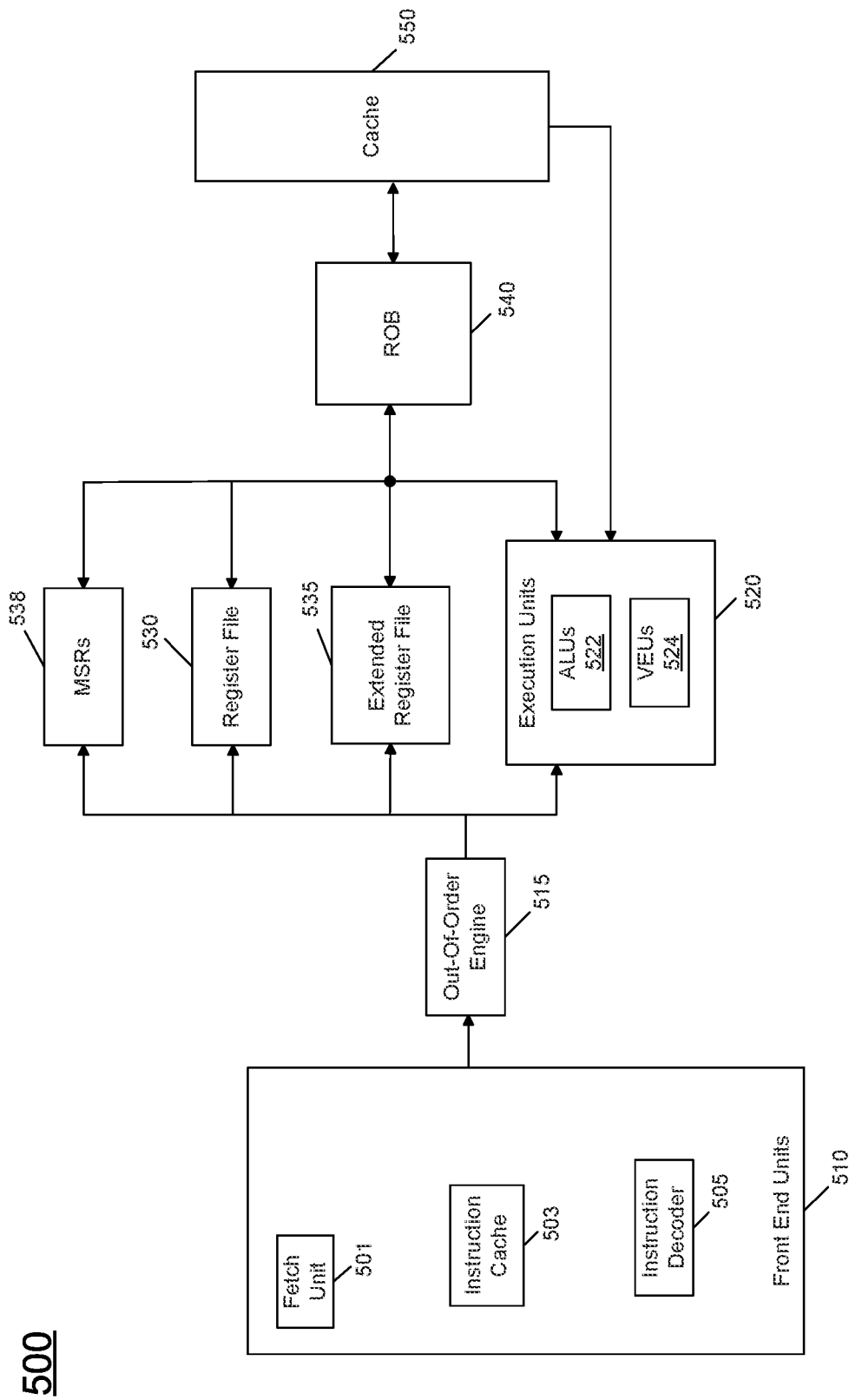
FIG. 5 is a block diagram of a micro-architecture of a processor core in accordance with one embodiment of the present invention.

Referring now to FIG. 5, shown is a block diagram of a micro-architecture of a processor core in accordance with one embodiment of the present invention. As shown in FIG. 5, processor core 500 may be a multi-stage pipelined out-of-order processor. As seen in FIG. 5, core 500 includes front end units 510, which may be used to fetch instructions to be executed and prepare them for use later in the processor pipeline. For example, front end units 510 may include a fetch unit 501, an instruction cache 503, and an instruction decoder 505. In some implementations, front end units 510 may further include a trace cache, along with microcode storage as well as a micro-operation storage. Fetch unit 501 may fetch macro-instructions, e.g., from memory or instruction cache 503, and feed them to instruction decoder 505 to decode them into primitives, i.e., micro-operations for execution by the processor.

Coupled between front end units 510 and execution units 520 is an out-of-order (OOO) engine 515 that may be used to receive the micro-instructions and prepare them for execution. More specifically OOO engine 515 may include various buffers to re-order micro-instruction flow and allocate various resources needed for execution, as well as to provide renaming of logical registers onto storage locations within various register files such as register file 530 and extended register file 535. Register file 530 may include separate register files for integer and floating point operations. Extended register file 535 may provide storage for vector-sized units, e.g., 256 or 512 bits per register. For purposes of configuration, control, and additional operations, a set of machine specific registers (MSRs) 538 may also be present and accessible to various logic within core 500 (and external to the core).

Various resources may be present in execution units 520, including, for example, various integer, floating point, and single instruction multiple data (SIMD) logic units, among other specialized hardware. For example, such execution units may include one or more arithmetic logic units (ALUs) 522 and one or more vector execution units 524, among other such execution units.

Results from the execution units may be provided to retirement logic, namely a reorder buffer (ROB) 540. More specifically, ROB 540 may include various arrays and logic to receive information associated with instructions that are executed. This information is then examined by ROB 540 to determine whether the instructions can be validly retired and result data committed to the architectural state of the processor, or whether one or more exceptions occurred that prevent a proper retirement of the instructions. Of course, ROB 540 may handle other operations associated with retirement.

As shown in FIG. 5, ROB 540 is coupled to a cache 550 which, in one embodiment may be a low level cache (e.g., an L1 cache) although the scope of the present invention is not limited in this regard. Also, execution units 520 can be directly coupled to cache 550. From cache 550, data communication may occur with higher level caches, system memory and so forth. While shown with this high level in the embodiment of FIG. 5, understand the scope of the present invention is not limited in this regard. For example, while the implementation of FIG. 5 is with regard to an out-of-order machine such as of an Intel® x86 instruction set architecture (ISA), the scope of the present invention is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

Figure 6:
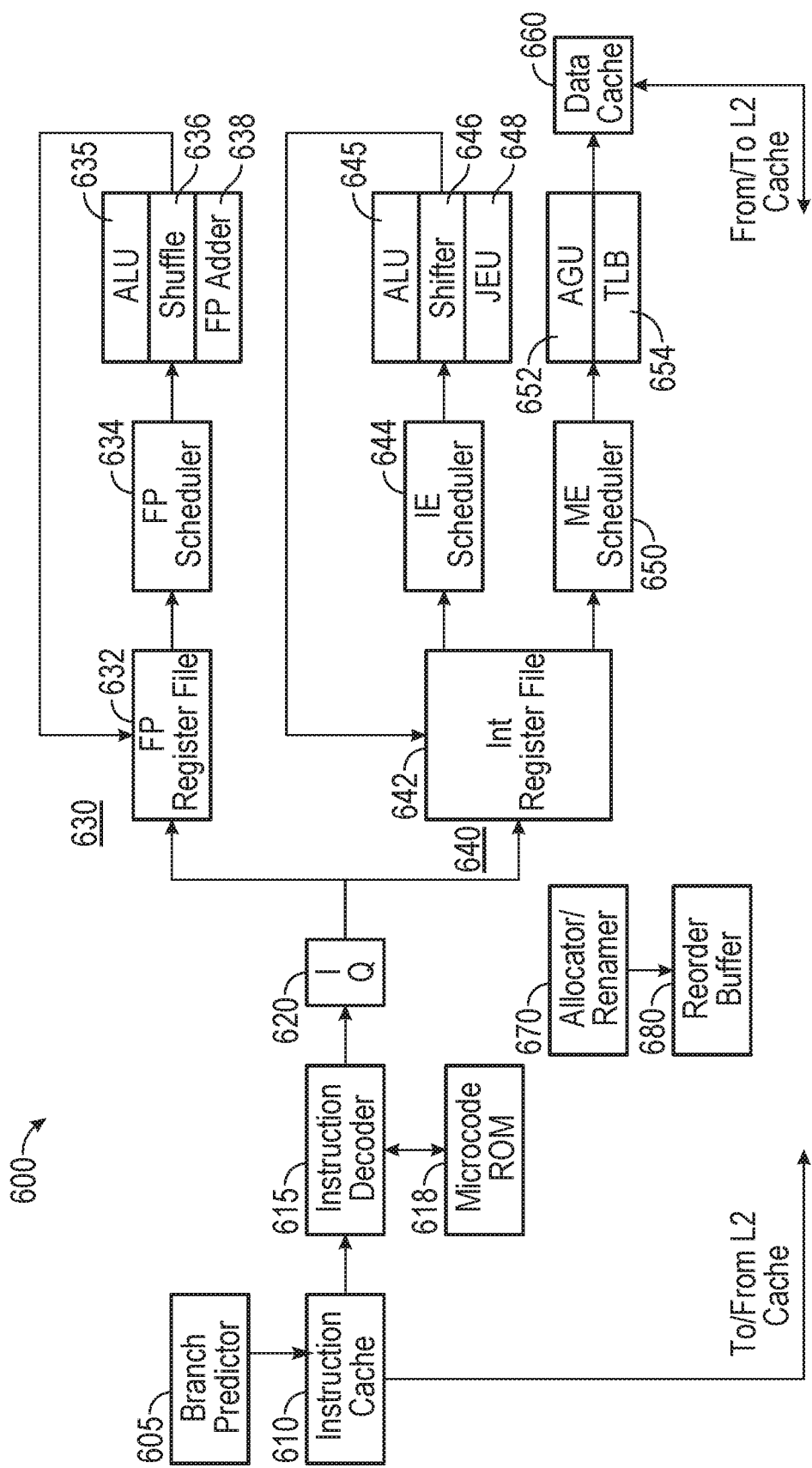
FIG. 6 is a block diagram of a micro-architecture of a processor core in accordance with another embodiment.

Referring now to FIG. 6, shown is a block diagram of a micro-architecture of a processor core in accordance with another embodiment. In the embodiment of FIG. 6, core 600 may be a low power core of a different micro-architecture, such as an Intel®. Atom™-based processor having a relatively limited pipeline depth designed to reduce power consumption. As seen, core 600 includes an instruction cache 610 coupled to provide instructions to an instruction decoder 615. A branch predictor 605 may be coupled to instruction cache 610. Note that instruction cache 610 may further be coupled to another level of a cache memory, such as an L2 cache (not shown for ease of illustration in FIG. 6).

In turn, instruction decoder 615 provides decoded instructions to an issue queue 620 for storage and delivery to a given execution pipeline. A microcode ROM 618 is coupled to instruction decoder 615.

A floating point pipeline 630 includes a floating point register file 632 which may include a plurality of architectural registers of a given bit with such as 128, 256 or 512 bits. Pipeline 630 includes a floating point scheduler 634 to schedule instructions for execution on one of multiple execution units of the pipeline. In the embodiment shown, such execution units include an ALU 635, a shuffle unit 636, and a floating point adder 638. In turn, results generated in these execution units may be provided back to buffers and/or registers of register file 632. Of course understand while shown with these few example execution units, additional or different floating point execution units may be present in another embodiment.

An integer pipeline 640 also may be provided. In the embodiment shown, pipeline 640 includes an integer register file 642 which may include a plurality of architectural registers of a given bit with such as 128 or 256 bits. Pipeline 640 includes an integer scheduler 644 to schedule instructions for execution on one of multiple execution units of the pipeline. In the embodiment shown, such execution units include an ALU 645, a shifter unit 646, and a jump execution unit 648. In turn, results generated in these execution units may be provided back to buffers and/or registers of register file 642. Of course understand while shown with these few example execution units, additional or different integer execution units may be present in another embodiment.

A memory execution scheduler 650 may schedule memory operations for execution in an address generation unit 652, which is also coupled to a TLB 654. As seen, these structures may couple to a data cache 660, which may be a L0 and/or L1 data cache that in turn couples to additional levels of a cache memory hierarchy, including an L2 cache memory.

To provide support for out-of-order execution, an allocator/renamer 670 may be provided, in addition to a reorder buffer 680, which is configured to reorder instructions executed out of order for retirement in order. Although shown with this particular pipeline architecture in the illustration of FIG. 6, understand that many variations and alternatives are possible.

Note that in a processor having asymmetric cores, such as in accordance with the micro-architectures of FIGS. 5 and 6, workloads may be dynamically swapped between the cores for power management reasons, as these cores, although having different pipeline designs and depths, may be of the same or related ISA. Such dynamic core swapping may be performed in a manner transparent to a user application (and possibly kernel also).

Figure 7:
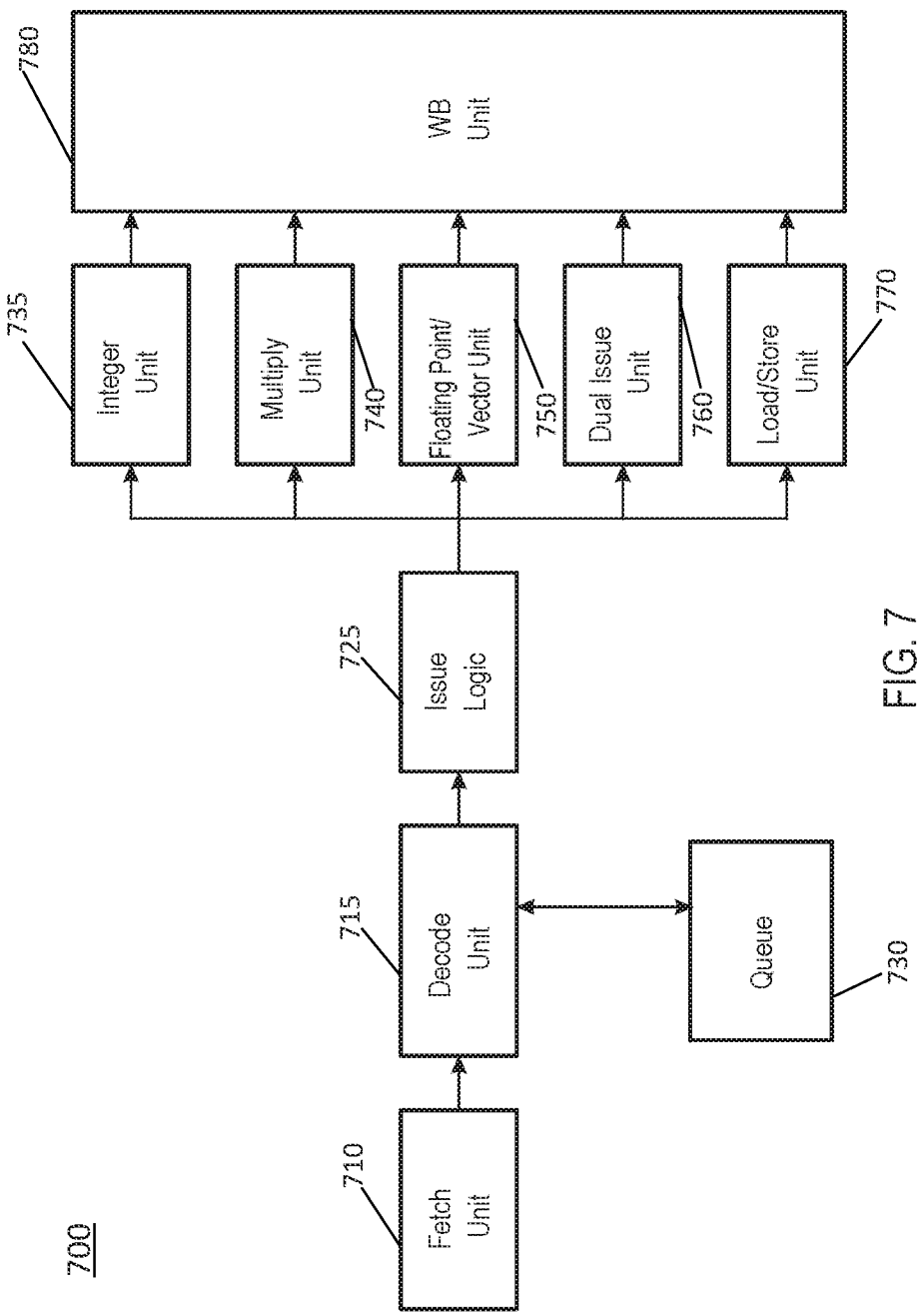
FIG. 7 is a block diagram of a micro-architecture of a processor core in accordance with yet another embodiment.

Referring to FIG. 7, shown is a block diagram of a micro-architecture of a processor core in accordance with yet another embodiment. As illustrated in FIG. 7, a core 700 may include a multi-staged in-order pipeline to execute at very low power consumption levels. As one such example, processor 700 may have a micro-architecture in accordance with an ARM Cortex A53 design available from ARM Holdings, LTD., Sunnyvale, Calif. In an implementation, an 8-stage pipeline may be provided that is configured to execute both 32-bit and 64-bit code. Core 700 includes a fetch unit 710 that is configured to fetch instructions and provide them to a decode unit 715, which may decode the instructions, e.g., macro-instructions of a given ISA such as an ARMv8 ISA. Note further that a queue 730 may couple to decode unit 715 to store decoded instructions. Decoded instructions are provided to an issue logic 725, where the decoded instructions may be issued to a given one of multiple execution units.

With further reference to FIG. 7, issue logic 725 may issue instructions to one of multiple execution units. In the embodiment shown, these execution units include an integer unit 735, a multiply unit 740, a floating point/vector unit 750, a dual issue unit 760, and a load/store unit 770. The results of these different execution units may be provided to a writeback unit 780. Understand that while a single writeback unit is shown for ease of illustration, in some implementations separate writeback units may be associated with each of the execution units. Furthermore, understand that while each of the units and logic shown in FIG. 7 is represented at a high level, a particular implementation may include more or different structures. A processor designed using one or more cores having a pipeline as in FIG. 7 may be implemented in many different end products, extending from mobile devices to server systems.

Figure 8:
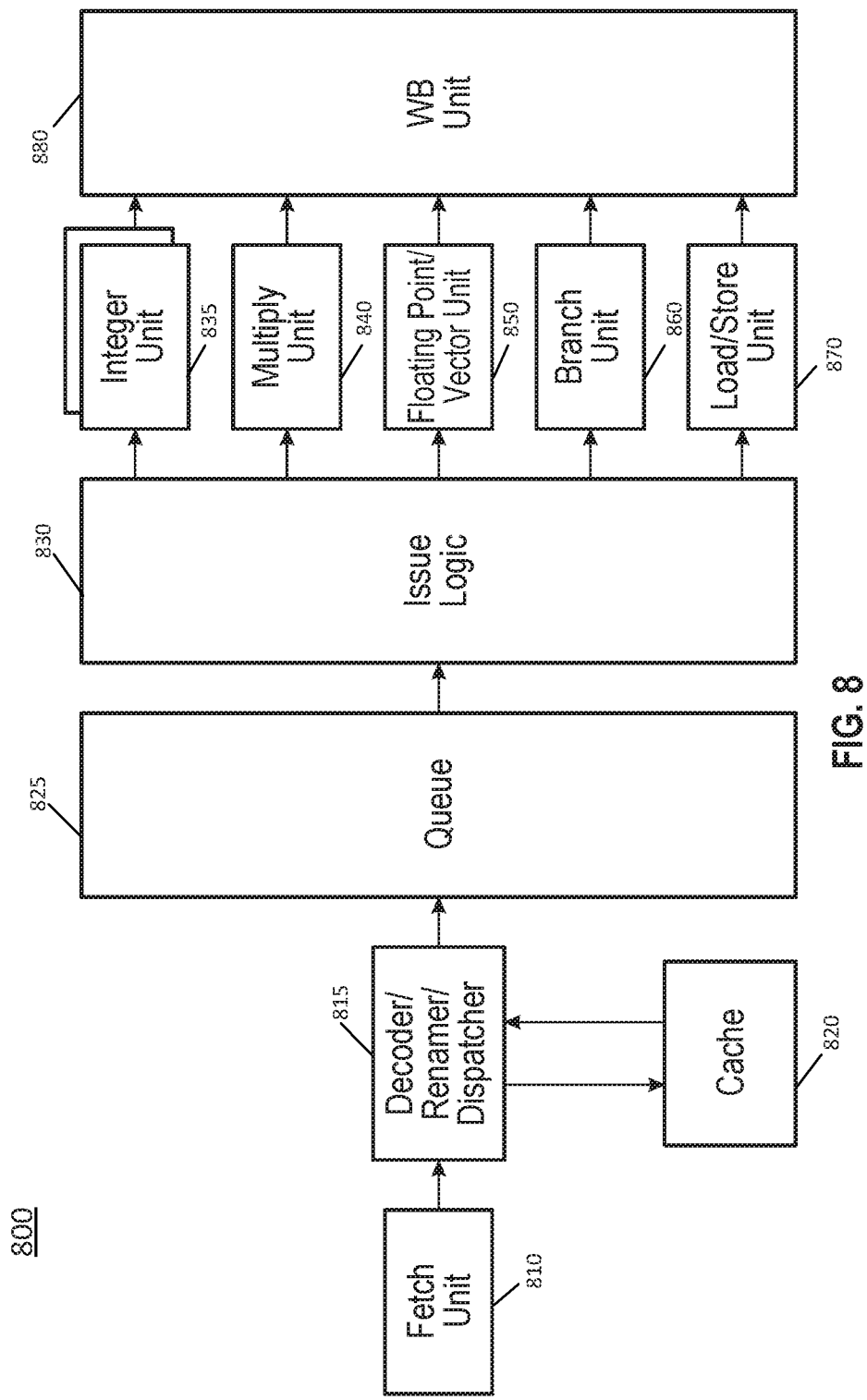
FIG. 8 is a block diagram of a micro-architecture of a processor core in accordance with a still further embodiment.

Referring to FIG. 8, shown is a block diagram of a micro-architecture of a processor core in accordance with a still further embodiment. As illustrated in FIG. 8, a core 800 may include a multi-stage multi-issue out-of-order pipeline to execute at very high performance levels (which may occur at higher power consumption levels than core 700 of FIG. 7). As one such example, processor 800 may have a microarchitecture in accordance with an ARM Cortex A57 design. In an implementation, a 15 (or greater)-stage pipeline may be provided that is configured to execute both 32-bit and 64-bit code. In addition, the pipeline may provide for 3 (or greater)-wide and 3 (or greater)-issue operation. Core 800 includes a fetch unit 810 that is configured to fetch instructions and provide them to a decoder/renamer/dispatcher 815, which may decode the instructions, e.g., macro-instructions of an ARMv8 instruction set architecture, rename register references within the instructions, and dispatch the instructions (eventually) to a selected execution unit. Decoded instructions may be stored in a queue 825. Note that while a single queue structure is shown for ease of illustration in FIG. 8, understand that separate queues may be provided for each of the multiple different types of execution units.

Also shown in FIG. 8 is an issue logic 830 from which decoded instructions stored in queue 825 may be issued to a selected execution unit. Issue logic 830 also may be implemented in a particular embodiment with a separate issue logic for each of the multiple different types of execution units to which issue logic 830 couples.

Decoded instructions may be issued to a given one of multiple execution units. In the embodiment shown, these execution units include one or more integer units 835, a multiply unit 840, a floating point/vector unit 850, a branch unit 860, and a load/store unit 870. In an embodiment, floating point/vector unit 850 may be configured to handle SIMD or vector data of 128 or 256 bits. Still further, floating point/vector execution unit 850 may perform IEEE-754 double precision floating-point operations. The results of these different execution units may be provided to a writeback unit 880. Note that in some implementations separate writeback units may be associated with each of the execution units. Furthermore, understand that while each of the units and logic shown in FIG. 8 is represented at a high level, a particular implementation may include more or different structures.

Note that in a processor having asymmetric cores, such as in accordance with the micro-architectures of FIGS. 7 and 8, workloads may be dynamically swapped for power management reasons, as these cores, although having different pipeline designs and depths, may be of the same or related ISA. Such dynamic core swapping may be performed in a manner transparent to a user application (and possibly kernel also).

Figure 9:
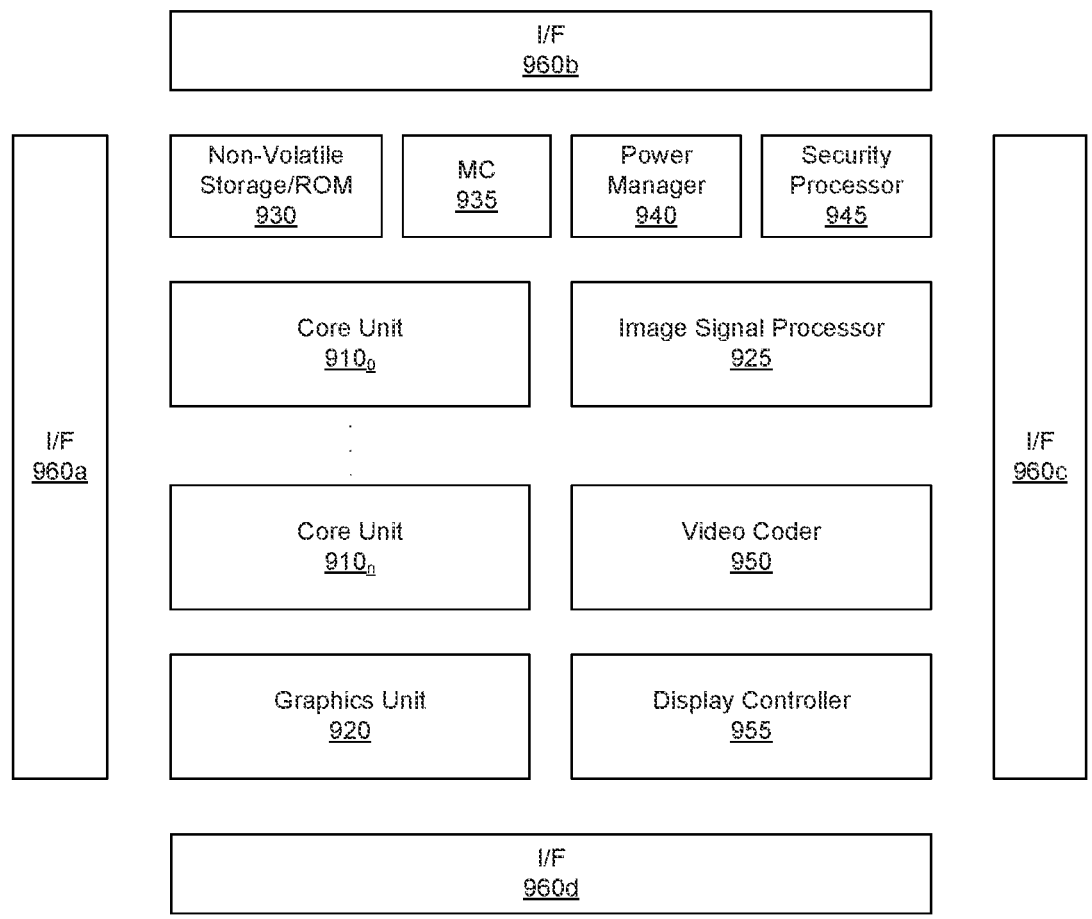
FIG. 9 is a block diagram of a processor in accordance with another embodiment of the present invention.

A processor designed using one or more cores having pipelines as in any one or more of FIGS. 5-8 may be implemented in many different end products, extending from mobile devices to server systems. Referring now to FIG. 9, shown is a block diagram of a processor in accordance with another embodiment of the present invention. In the embodiment of FIG. 9, processor 900 may be a SoC including multiple domains, each of which may be controlled to operate at an independent operating voltage and operating frequency. As a specific illustrative example, processor 900 may be an Intel® Architecture Core™-based processor such as an i3, i5, i7 or another such processor available from Intel Corporation. However, other low power processors such as available from Advanced Micro Devices, Inc. (AMD) of Sunnyvale, Calif., an ARM-based design from ARM Holdings, Ltd. or licensee thereof or a MIPS-based design from MIPS Technologies, Inc. of Sunnyvale, Calif. or a RISC-V-based design, or their licensees or adopters may instead be present in other embodiments such as an Apple A9 processor, a Qualcomm Snapdragon processor, or Texas Instruments OMAP processor. Such SoC may be used in a low power system such as a smartphone, tablet computer, phablet computer, Ultrabook™ computer or other portable computing device or connected device.

In the high level view shown in FIG. 9, processor 900 includes a plurality of core units $910_0$-$910_n$. Each core unit may include one or more processor cores, one or more cache memories and other circuitry. Each core unit 910 may support one or more instructions sets (e.g., an x86 instruction set (with some extensions that have been added with newer versions); a MIPS instruction set; an ARM instruction set (with optional additional extensions such as NEON)) or other instruction set or combinations thereof. Note that some of the core units may be heterogeneous resources (e.g., of a different design). In addition, each such core may be coupled to a cache memory (not shown) which in an embodiment may be a shared level (L2) cache memory. A non-volatile storage 930 may be used to store various program and other data. For example, this storage may be used to store at least portions of microcode, boot information such as a BIOS, other system software or so forth.

Each core unit 910 may also include an interface such as a bus interface unit to enable interconnection to additional circuitry of the processor. In an embodiment, each core unit 910 couples to a coherent fabric that may act as a primary cache coherent on-die interconnect that in turn couples to a memory controller 935. In turn, memory controller 935 controls communications with a memory such as a DRAM (not shown for ease of illustration in FIG. 9).

In addition to core units, additional processing engines are present within the processor, including at least one graphics unit 920 which may include one or more graphics processing units (GPUs) to perform graphics processing as well as to possibly execute general purpose operations on the graphics processor (so-called GPGPU operation). In addition, at least one image signal processor 925 may be present. Signal processor 925 may be configured to process incoming image data received from one or more capture devices, either internal to the SoC or off-chip.

Other accelerators also may be present. In the illustration of FIG. 9, a video coder 950 may perform coding operations including encoding and decoding for video information, e.g., providing hardware acceleration support for high definition video content. A display controller 955 further may be provided to accelerate display operations including providing support for internal and external displays of a system. In addition, a security processor 945 may be present to perform security operations such as secure boot operations, various cryptography operations and so forth.

Each of the units may have its power consumption controlled via a power manager 940, which may include control logic to perform the various power management techniques described herein.

In some embodiments, SoC 900 may further include a non-coherent fabric coupled to the coherent fabric to which various peripheral devices may couple. One or more interfaces 960a-960d enable communication with one or more off-chip devices. Such communications may be via a variety of communication protocols such as PCIe™ GPIO, USB, I²C, UART, MIPI, SDIO, DDR, SPI, HDMI, among other types of communication protocols. Although shown at this high level in the embodiment of FIG. 9, understand the scope of the present invention is not limited in this regard.

Figure 10:
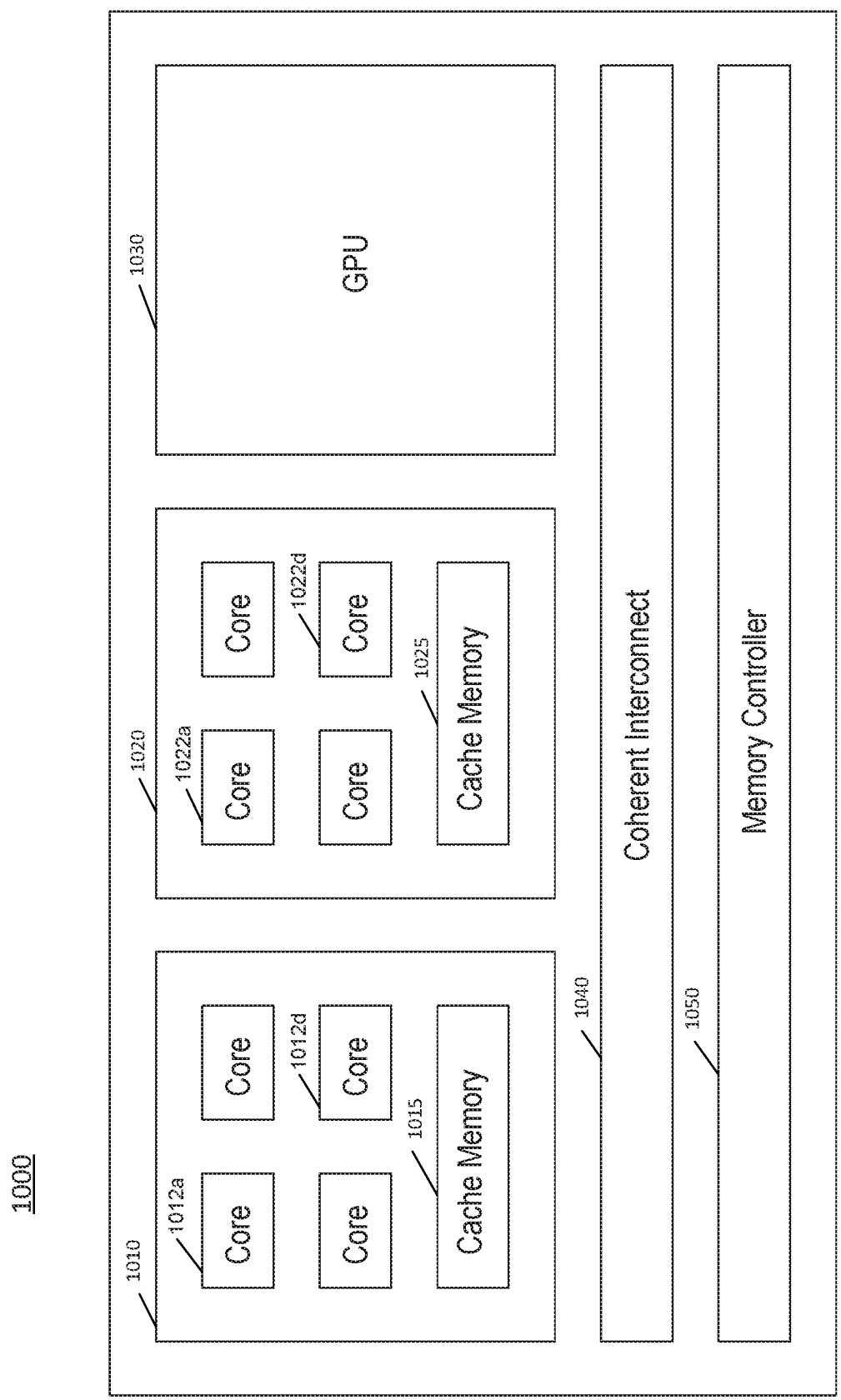
FIG. 10 is a block diagram of a representative SoC in accordance with an embodiment of the present invention.

Referring now to FIG. 10, shown is a block diagram of a representative SoC. In the embodiment shown, SoC 1000 may be a multi-core SoC configured for low power operation to be optimized for incorporation into a smartphone or other low power device such as a tablet computer or other portable computing device. As an example, SoC 1000 may be implemented using asymmetric or different types of cores, such as combinations of higher power and/or low power cores, e.g., out-of-order cores and in-order cores. In different embodiments, these cores may be based on an Intel® Architecture™ core design or an ARM architecture design. In yet other embodiments, a mix of Intel® and ARM cores may be implemented in a given SoC.

As seen in FIG. 10, SoC 1000 includes a first core domain 1010 having a plurality of first cores $1012_0$-$1012_3$. In an example, these cores may be low power cores such as in-order cores. In one embodiment these first cores may be implemented as ARM Cortex A53 cores. In turn, these cores couple to a cache memory 1015 of core domain 1010. In addition, SoC 1000 includes a second core domain 1020. In the illustration of FIG. 10, second core domain 1020 has a plurality of second cores $1022_0$-$1022_3$. In an example, these cores may be higher power-consuming cores than first cores 1012. In an embodiment, the second cores may be out-of-order cores, which may be implemented as ARM Cortex A57 cores. In turn, these cores couple to a cache memory 1025 of core domain 1020. Note that while the example shown in FIG. 10 includes 4 cores in each domain, understand that more or fewer cores may be present in a given domain in other examples.

With further reference to FIG. 10, a graphics domain 1030 also is provided, which may include one or more graphics processing units (GPUs) configured to independently execute graphics workloads, e.g., provided by one or more cores of core domains 1010 and 1020. As an example, GPU domain 1030 may be used to provide display support for a variety of screen sizes, in addition to providing graphics and display rendering operations.

As seen, the various domains couple to a coherent interconnect 1040, which in an embodiment may be a cache coherent interconnect fabric that in turn couples to an integrated memory controller 1050. Coherent interconnect 1040 may include a shared cache memory, such as an L3 cache, in some examples. In an embodiment, memory controller 1050 may be a direct memory controller to provide for multiple channels of communication with an off-chip memory, such as multiple channels of a DRAM (not shown for ease of illustration in FIG. 10).

In different examples, the number of the core domains may vary. For example, for a low power SoC suitable for incorporation into a mobile computing device, a limited number of core domains such as shown in FIG. 10 may be present. Still further, in such low power SoCs, core domain 1020 including higher power cores may have fewer numbers of such cores. For example, in one implementation two cores 1022 may be provided to enable operation at reduced power consumption levels. In addition, the different core domains may also be coupled to an interrupt controller to enable dynamic swapping of workloads between the different domains.

In yet other embodiments, a greater number of core domains, as well as additional optional IP logic may be present, in that an SoC can be scaled to higher performance (and power) levels for incorporation into other computing devices, such as desktops, servers, high performance computing systems, base stations forth. As one such example, 4 core domains each having a given number of out-of-order cores may be provided. Still further, in addition to optional GPU support (which as an example may take the form of a GPGPU), one or more accelerators to provide optimized hardware support for particular functions (e.g. web serving, network processing, switching or so forth) also may be provided. In addition, an input/output interface may be present to couple such accelerators to off-chip components.

Figure 11:
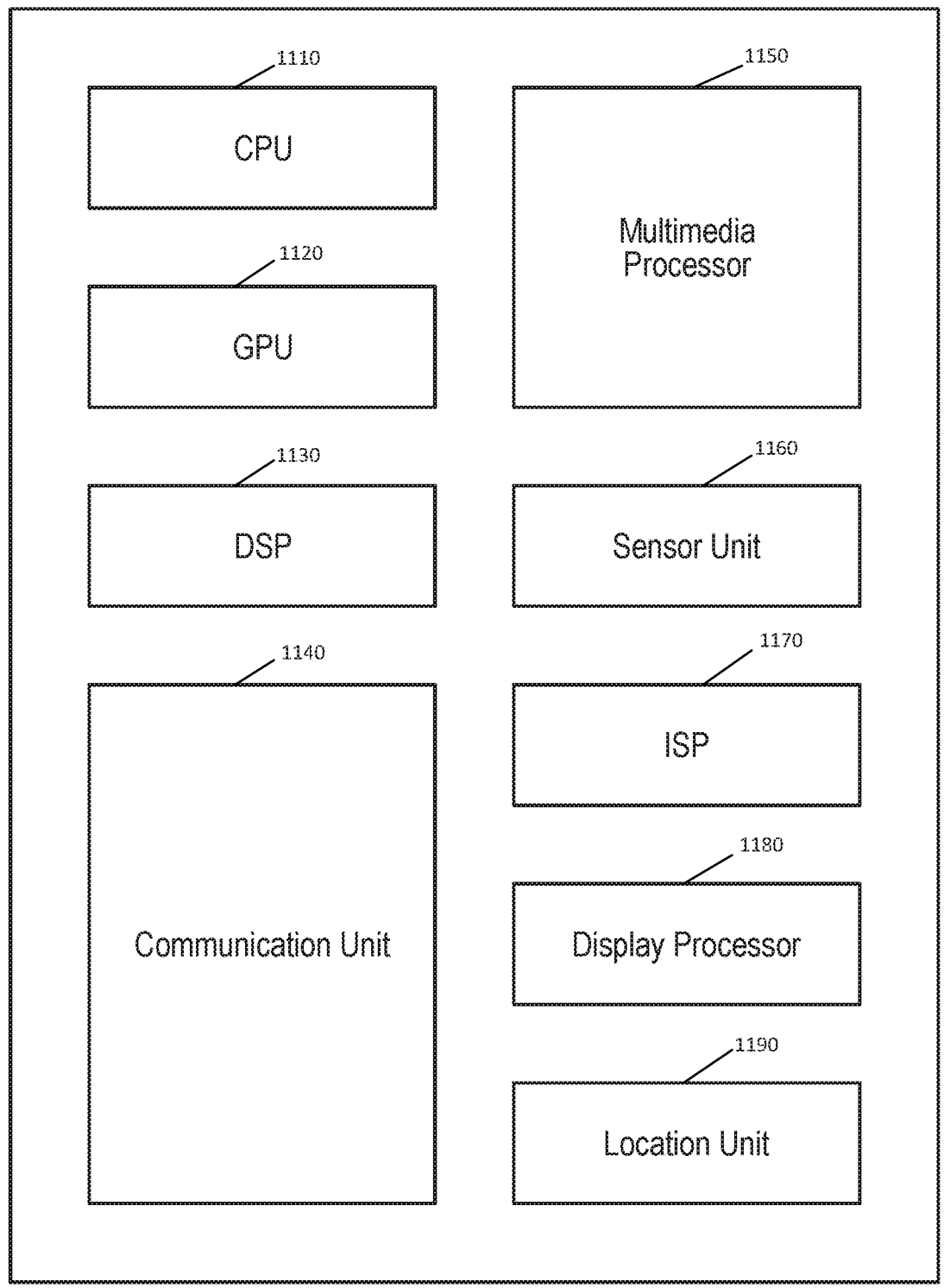
FIG. 11 is a block diagram of another example SoC in accordance with an embodiment of the present invention.

Referring now to FIG. 11, shown is a block diagram of another example SoC. In the embodiment of FIG. 11, SoC 1100 may include various circuitry to enable high performance for multimedia applications, communications and other functions. As such, SoC 1100 is suitable for incorporation into a wide variety of portable and other devices, such as smartphones, tablet computers, smart TVs and so forth. In the example shown, SoC 1100 includes a central processor unit (CPU) domain 1110. In an embodiment, a plurality of individual processor cores may be present in CPU domain 1110. As one example, CPU domain 1110 may be a quad core processor having 4 multithreaded cores. Such processors may be homogeneous or heterogeneous processors, e.g., a mix of low power and high power processor cores.

In turn, a GPU domain 1120 is provided to perform advanced graphics processing in one or more GPUs to handle graphics and compute APIs. A DSP unit 1130 may provide one or more low power DSPs for handling low-power multimedia applications such as music playback, audio/video and so forth, in addition to advanced calculations that may occur during execution of multimedia instructions. In turn, a communication unit 1140 may include various components to provide connectivity via various wireless protocols, such as cellular communications (including 3G/4G LTE), wireless local area protocols such as Bluetooth™, IEEE 802.11, and so forth.

Still further, a multimedia processor 1150 may be used to perform capture and playback of high definition video and audio content, including processing of user gestures. A sensor unit 1160 may include a plurality of sensors and/or a sensor controller to interface to various off-chip sensors present in a given platform. An image signal processor 1170 may be provided with one or more separate ISPs to perform image processing with regard to captured content from one or more cameras of a platform, including still and video cameras.

A display processor 1180 may provide support for connection to a high definition display of a given pixel density, including the ability to wirelessly communicate content for playback on such display. Still further, a location unit 1190 may include a GPS receiver with support for multiple GPS constellations to provide applications highly accurate positioning information obtained using as such GPS receiver. Understand that while shown with this particular set of components in the example of FIG. 11, many variations and alternatives are possible.

Figure 12:
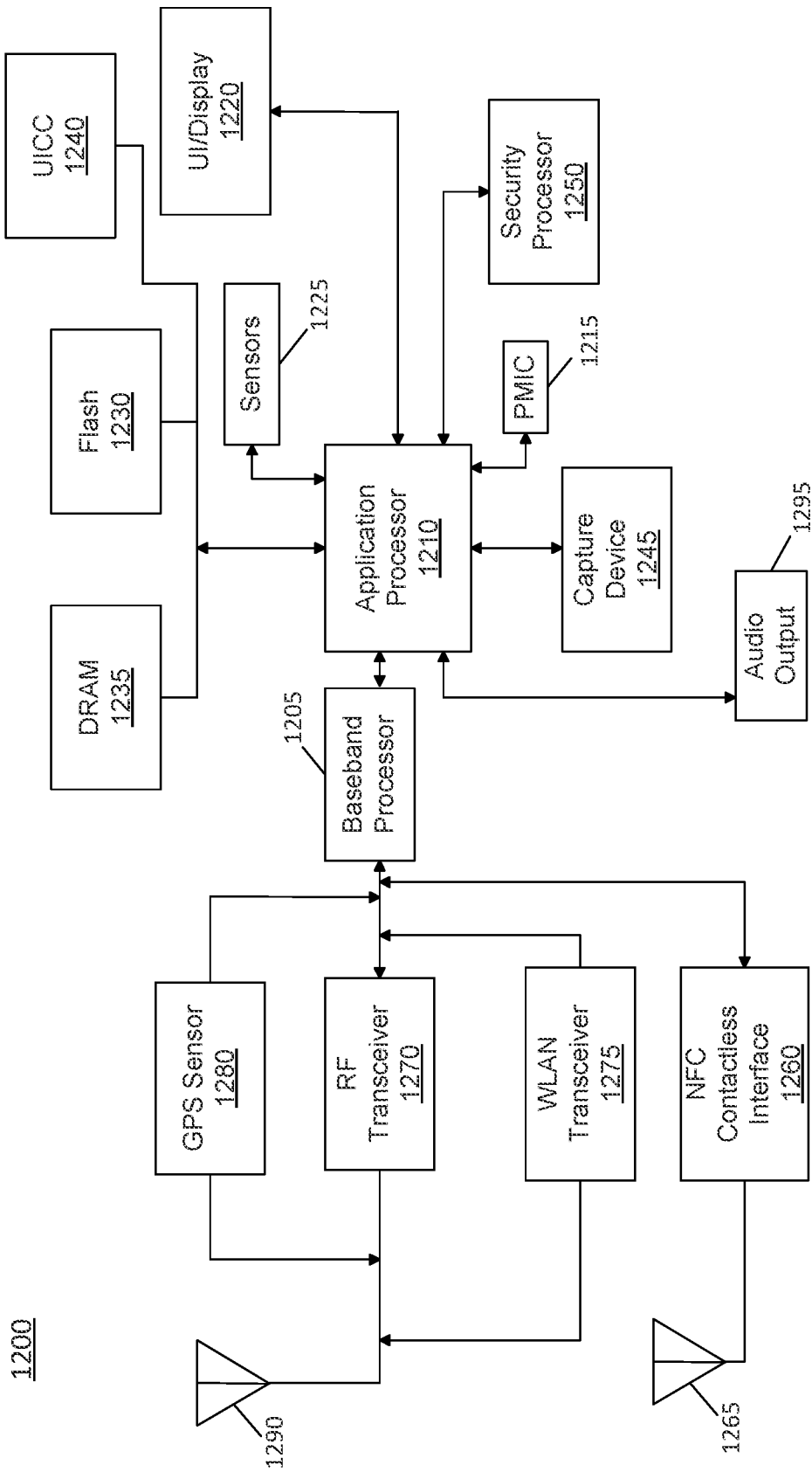
FIG. 12 is a block diagram of an example system with which embodiments can be used.

Referring now to FIG. 12, shown is a block diagram of an example system with which embodiments can be used. As seen, system 1200 may be a smartphone or other wireless communicator. A baseband processor 1205 is configured to perform various signal processing with regard to communication signals to be transmitted from or received by the system. In turn, baseband processor 1205 is coupled to an application processor 1210, which may be a main CPU of the system to execute an OS and other system software, in addition to user applications such as many well-known social media and multimedia apps. Application processor 1210 may further be configured to perform a variety of other computing operations for the device and perform the power management techniques described herein.

In turn, application processor 1210 can couple to a user interface/display 1220, e.g., a touch screen display. In addition, application processor 1210 may couple to a memory system including a non-volatile memory, namely a flash memory 1230 and a system memory, namely a dynamic random access memory (DRAM) 1235. As further seen, application processor 1210 further couples to a capture device 1240 such as one or more image capture devices that can record video and/or still images.

Still referring to FIG. 12, a universal integrated circuit card (UICC) 1240 comprising a subscriber identity module and possibly a secure storage and cryptoprocessor is also coupled to application processor 1210. System 1200 may further include a security processor 1250 that may couple to application processor 1210. A plurality of sensors 1225 may couple to application processor 1210 to enable input of a variety of sensed information such as accelerometer and other environmental information. An audio output device 1295 may provide an interface to output sound, e.g., in the form of voice communications, played or streaming audio data and so forth.

As further illustrated, a near field communication (NFC) contactless interface 1260 is provided that communicates in a NFC near field via an NFC antenna 1265. While separate antennae are shown in FIG. 12, understand that in some implementations one antenna or a different set of antennae may be provided to enable various wireless functionality.

A PMIC 1215 couples to application processor 1210 to perform platform level power management. To this end, PMIC 1215 may issue power management requests to application processor 1210 to enter certain low power states as desired. Furthermore, based on platform constraints, PMIC 1215 may also control the power level of other components of system 1200.

To enable communications to be transmitted and received, various circuitry may be coupled between baseband processor 1205 and an antenna 1290. Specifically, a radio frequency (RF) transceiver 1270 and a wireless local area network (WLAN) transceiver 1275 may be present. In general, RF transceiver 1270 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 1280 may be present. Other wireless communications such as receipt or transmission of radio signals, e.g., AM/FM and other signals may also be provided. In addition, via WLAN transceiver 1275, local wireless communications can also be realized.

Figure 13:
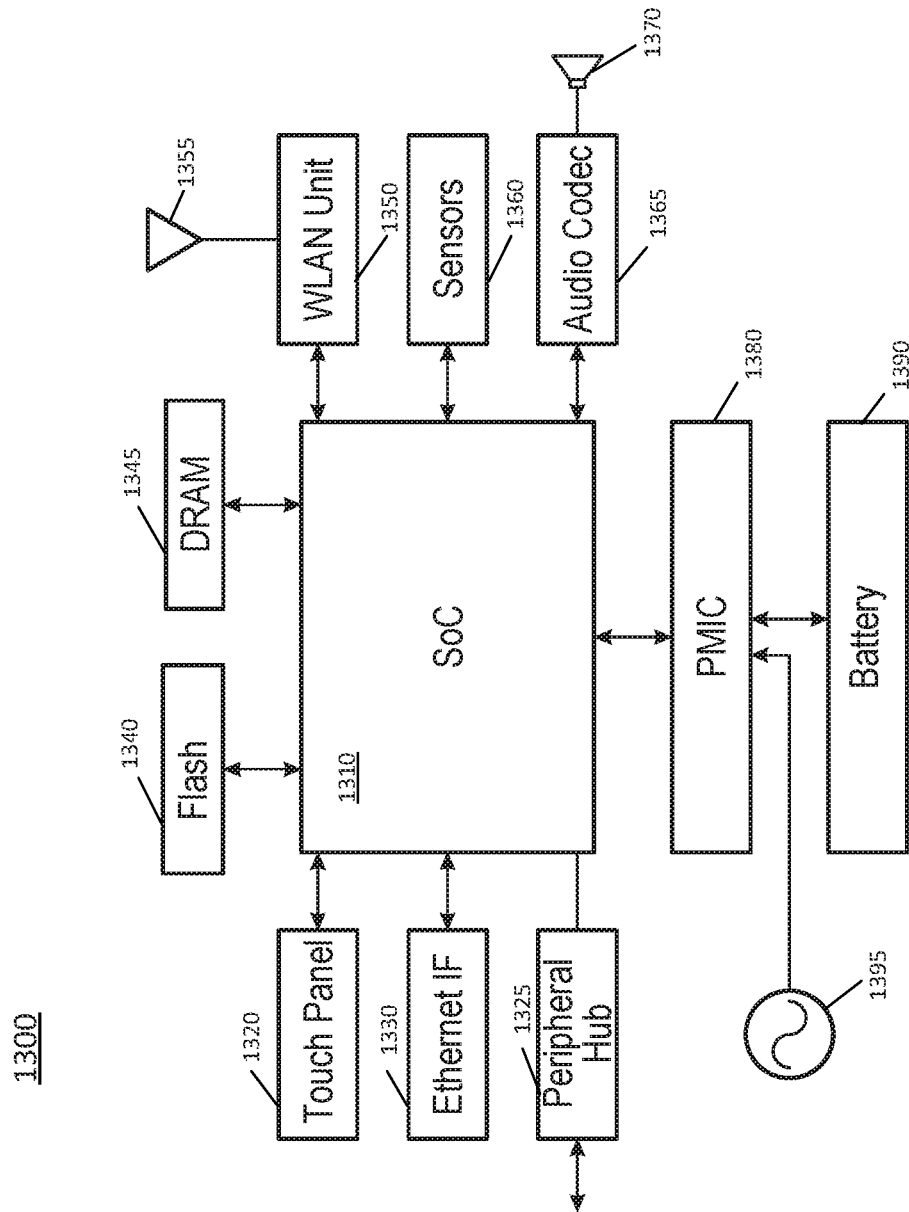
FIG. 13 is a block diagram of another example system with which embodiments may be used.

Referring now to FIG. 13, shown is a block diagram of another example system with which embodiments may be used. In the illustration of FIG. 13, system 1300 may be mobile low-power system such as a tablet computer, 2:1 tablet, phablet or other convertible or standalone tablet system. As illustrated, a SoC 1310 is present and may be configured to operate as an application processor for the device and perform the power management techniques described herein.

A variety of devices may couple to SoC 1310. In the illustration shown, a memory subsystem includes a flash memory 1340 and a DRAM 1345 coupled to SoC 1310. In addition, a touch panel 1320 is coupled to the SoC 1310 to provide display capability and user input via touch, including provision of a virtual keyboard on a display of touch panel 1320. To provide wired network connectivity, SoC 1310 couples to an Ethernet interface 1330. A peripheral hub 1325 is coupled to SoC 1310 to enable interfacing with various peripheral devices, such as may be coupled to system 1300 by any of various ports or other connectors.

In addition to internal power management circuitry and functionality within SoC 1310, a PMIC 1380 is coupled to SoC 1310 to provide platform-based power management, e.g., based on whether the system is powered by a battery 1390 or AC power via an AC adapter 1395. In addition to this power source-based power management, PMIC 1380 may further perform platform power management activities based on environmental and usage conditions. Still further, PMIC 1380 may communicate control and status information to SoC 1310 to cause various power management actions within SoC 1310.

Still referring to FIG. 13, to provide for wireless capabilities, a WLAN unit 1350 is coupled to SoC 1310 and in turn to an antenna 1355. In various implementations, WLAN unit 1350 may provide for communication according to one or more wireless protocols.

As further illustrated, a plurality of sensors 1360 may couple to SoC 1310. These sensors may include various accelerometer, environmental and other sensors, including user gesture sensors. Finally, an audio codec 1365 is coupled to SoC 1310 to provide an interface to an audio output device 1370. Of course understand that while shown with this particular implementation in FIG. 13, many variations and alternatives are possible.

Figure 14:
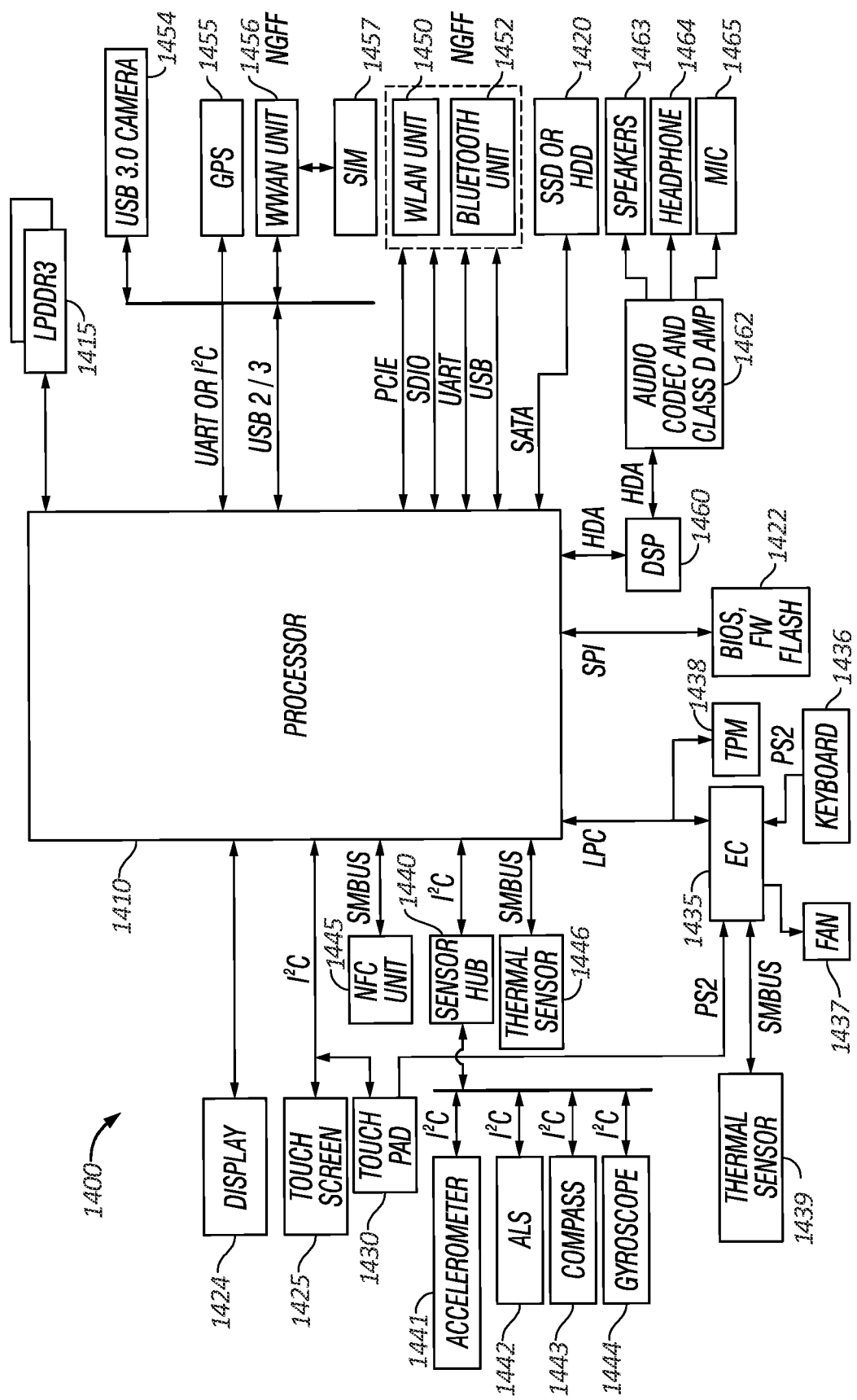
FIG. 14 is a block diagram of a representative computer system.

Referring now to FIG. 14, shown is a block diagram of a representative computer system such as notebook, Ultrabook™ or other small form factor system. A processor 1410, in one embodiment, includes a microprocessor, multi-core processor, multithreaded processor, an ultra low voltage processor, an embedded processor, or other known processing element. In the illustrated implementation, processor 1410 acts as a main processing unit and central hub for communication with many of the various components of the system 1400. As one example, processor 1400 is implemented as a SoC.

Processor 1410, in one embodiment, communicates with a system memory 1415. As an illustrative example, the system memory 1415 is implemented via multiple memory devices or modules to provide for a given amount of system memory.

To provide for persistent storage of information such as data, applications, one or more operating systems and so forth, a mass storage 1420 may also couple to processor 1410. In various embodiments, to enable a thinner and lighter system design as well as to improve system responsiveness, this mass storage may be implemented via a SSD or the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 14, a flash device 1422 may be coupled to processor 1410, e.g., via a serial peripheral interface (SPI). This flash device may provide for non-volatile storage of system software, including a basic input/output software (BIOS) as well as other firmware of the system.

Various input/output (I/O) devices may be present within system 1400. Specifically shown in the embodiment of FIG. 14 is a display 1424 which may be a high definition LCD or LED panel that further provides for a touch screen 1425. In one embodiment, display 1424 may be coupled to processor 1410 via a display interconnect that can be implemented as a high performance graphics interconnect. Touch screen 1425 may be coupled to processor 1410 via another interconnect, which in an embodiment can be an I²C interconnect. As further shown in FIG. 14, in addition to touch screen 1425, user input by way of touch can also occur via a touch pad 1430 which may be configured within the chassis and may also be coupled to the same I²C interconnect as touch screen 1425.

For perceptual computing and other purposes, various sensors may be present within the system and may be coupled to processor 1410 in different manners. Certain inertial and environmental sensors may couple to processor 1410 through a sensor hub 1440, e.g., via an I²C or I3C interconnect. In the embodiment shown in FIG. 14, these sensors may include an accelerometer 1441, an ambient light sensor (ALS) 1442, a compass 1443 and a gyroscope 1444. Other environmental sensors may include one or more thermal sensors 1446 which in some embodiments couple to processor 1410 via a system management bus (SMBus) bus.

Also seen in FIG. 14, various peripheral devices may couple to processor 1410 via a low pin count (LPC) interconnect. In the embodiment shown, various components can be coupled through an embedded controller 1435. Such components can include a keyboard 1436 (e.g., coupled via a PS2 interface), a fan 1437, and a thermal sensor 1439. In some embodiments, touch pad 1430 may also couple to EC 1435 via a PS2 interface. In addition, a security processor such as a trusted platform module (TPM) 1438 may also couple to processor 1410 via this LPC interconnect.

System 1400 can communicate with external devices in a variety of manners, including wirelessly. In the embodiment shown in FIG. 14, various wireless modules, each of which can correspond to a radio configured for a particular wireless communication protocol, are present. One manner for wireless communication in a short range such as a near field may be via a NFC unit 1445 which may communicate, in one embodiment with processor 1410 via an SMBus. Note that via this NFC unit 1445, devices in close proximity to each other can communicate.

As further seen in FIG. 14, additional wireless units can include other short range wireless engines including a WLAN unit 1450 and a Bluetooth unit 1452. Using WLAN unit 1450, Wi-Fi™ communications can be realized, while via Bluetooth unit 1452, short range Bluetooth™ communications can occur. These units may communicate with processor 1410 via a given link.

In addition, wireless wide area communications, e.g., according to a cellular or other wireless wide area protocol, can occur via a WWAN unit 1456 which in turn may couple to a subscriber identity module (SIM) 1457. In addition, to enable receipt and use of location information, a GPS module 1455 may also be present. Note that in the embodiment shown in FIG. 14, WWAN unit 1456 and an integrated capture device such as a camera module 1454 may communicate via a given link.

An integrated camera module 1454 can be incorporated in the lid. To provide for audio inputs and outputs, an audio processor can be implemented via a digital signal processor (DSP) 1460, which may couple to processor 1410 via a high definition audio (HDA) link. Similarly, DSP 1460 may communicate with an integrated coder/decoder (CODEC) and amplifier 1462 that in turn may couple to output speakers 1463 which may be implemented within the chassis. Similarly, amplifier and CODEC 1462 can be coupled to receive audio inputs from a microphone 1465 which in an embodiment can be implemented via dual array microphones (such as a digital microphone array) to provide for high quality audio inputs to enable voice-activated control of various operations within the system. Note also that audio outputs can be provided from amplifier/CODEC 1462 to a headphone jack 1464. Although shown with these particular components in the embodiment of FIG. 14, understand the scope of the present invention is not limited in this regard.

Figure 15:
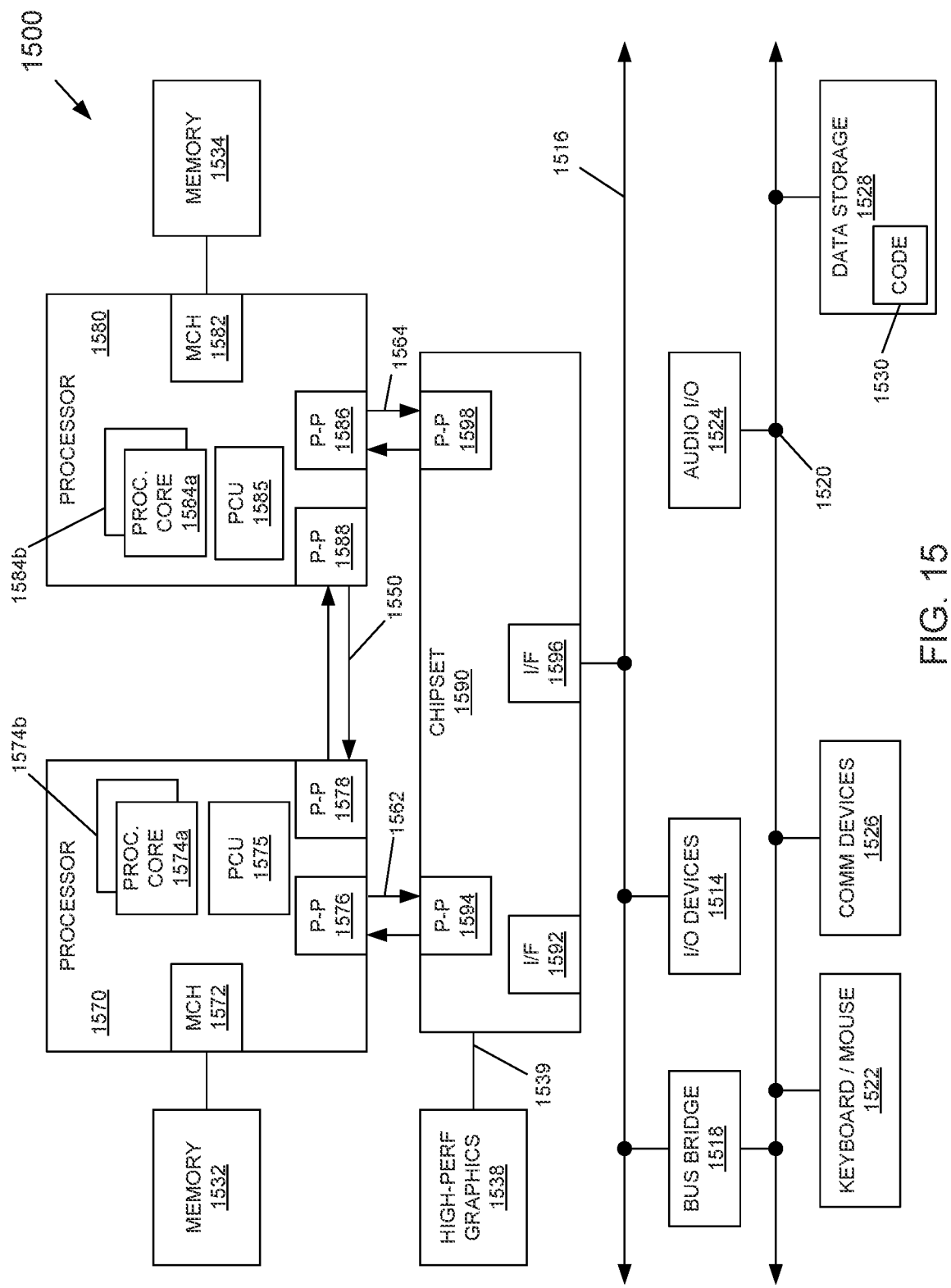
FIG. 15 is a block diagram of a system in accordance with an embodiment of the present invention.

Embodiments may be implemented in many different system types. Referring now to FIG. 15, shown is a block diagram of a system in accordance with an embodiment of the present invention. As shown in FIG. 15, multiprocessor system 1500 is a point-to-point interconnect system, and includes a first processor 1570 and a second processor 1580 coupled via a point-to-point interconnect 1550. As shown in FIG. 15, each of processors 1570 and 1580 may be multicore processors, including first and second processor cores (i.e., processors 1574a and 1574b and processor cores 1584a and 1584b), although potentially many more cores may be present in the processors. Each of the processors can include a PCU 1575, 1585 to perform processor-based power management, including the static or dynamic control of voltage regulators, as described herein.

Still referring to FIG. 15, first processor 1570 further includes a memory controller hub (MCH) 1572 and point-to-point (P-P) interfaces 1576 and 1578. Similarly, second processor 1580 includes a MCH 1582 and P-P interfaces 1586 and 1588. As shown in FIG. 15, MCH's 1572 and 1582 couple the processors to respective memories, namely a memory 1532 and a memory 1534, which may be portions of system memory (e.g., DRAM) locally attached to the respective processors. First processor 1570 and second processor 1580 may be coupled to a chipset 1590 via P-P interconnects 1562 and 1564, respectively. As shown in FIG. 15, chipset 1590 includes P-P interfaces 1594 and 1598.

Furthermore, chipset 1590 includes an interface 1592 to couple chipset 1590 with a high performance graphics engine 1538, by a P-P interconnect 1539. In turn, chipset 1590 may be coupled to a first bus 1516 via an interface 1596. As shown in FIG. 15, various input/output (I/O) devices 1514 may be coupled to first bus 1516, along with a bus bridge 1518 which couples first bus 1516 to a second bus 1520. Various devices may be coupled to second bus 1520 including, for example, a keyboard/mouse 1522, communication devices 1526 and a data storage unit 1528 such as a disk drive or other mass storage device which may include code 1530, in one embodiment. Further, an audio I/O 1524 may be coupled to second bus 1520. Embodiments can be incorporated into other types of systems including mobile devices such as a smart cellular telephone, tablet computer, netbook, Ultrabook™, or so forth.

Figure 16:
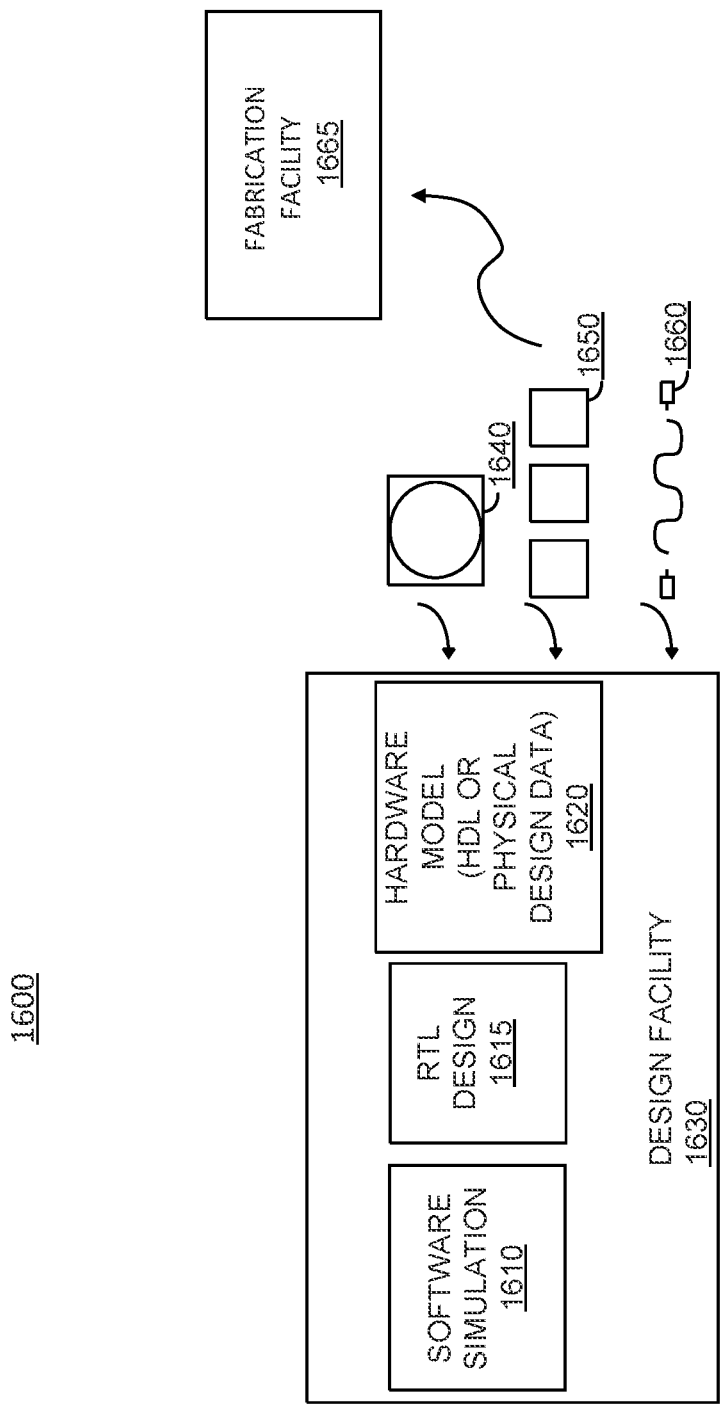
FIG. 16 is a block diagram illustrating an IP core development system used to manufacture an integrated circuit to perform operations according to an embodiment.

FIG. 16 is a block diagram illustrating an IP core development system 1600 that may be used to manufacture an integrated circuit to perform operations according to an embodiment. The IP core development system 1600 may be used to generate modular, re-usable designs that can be incorporated into a larger design or used to construct an entire integrated circuit (e.g., an SoC integrated circuit). A design facility 1630 can generate a software simulation 1610 of an IP core design in a high level programming language (e.g., C/C++). The software simulation 1610 can be used to design, test, and verify the behavior of the IP core. A register transfer level (RTL) design can then be created or synthesized from the simulation model. The RTL design 1615 is an abstraction of the behavior of the integrated circuit that models the flow of digital signals between hardware registers, including the associated logic performed using the modeled digital signals. In addition to an RTL design 1615, lower-level designs at the logic level or transistor level may also be created, designed, or synthesized. Thus, the particular details of the initial design and simulation may vary.

The RTL design 1615 or equivalent may be further synthesized by the design facility into a hardware model 1620, which may be in a hardware description language (HDL), or some other representation of physical design data. The HDL may be further simulated or tested to verify the IP core design. The IP core design can be stored for delivery to a third party fabrication facility 1665 using non-volatile memory 1640 (e.g., hard disk, flash memory, or any non-volatile storage medium). Alternately, the IP core design may be transmitted (e.g., via the Internet) over a wired connection 1650 or wireless connection 1660. The fabrication facility 1665 may then fabricate an integrated circuit that is based at least in part on the IP core design. The fabricated integrated circuit can be configured to perform operations in accordance with at least one embodiment described herein.

Figure 17:
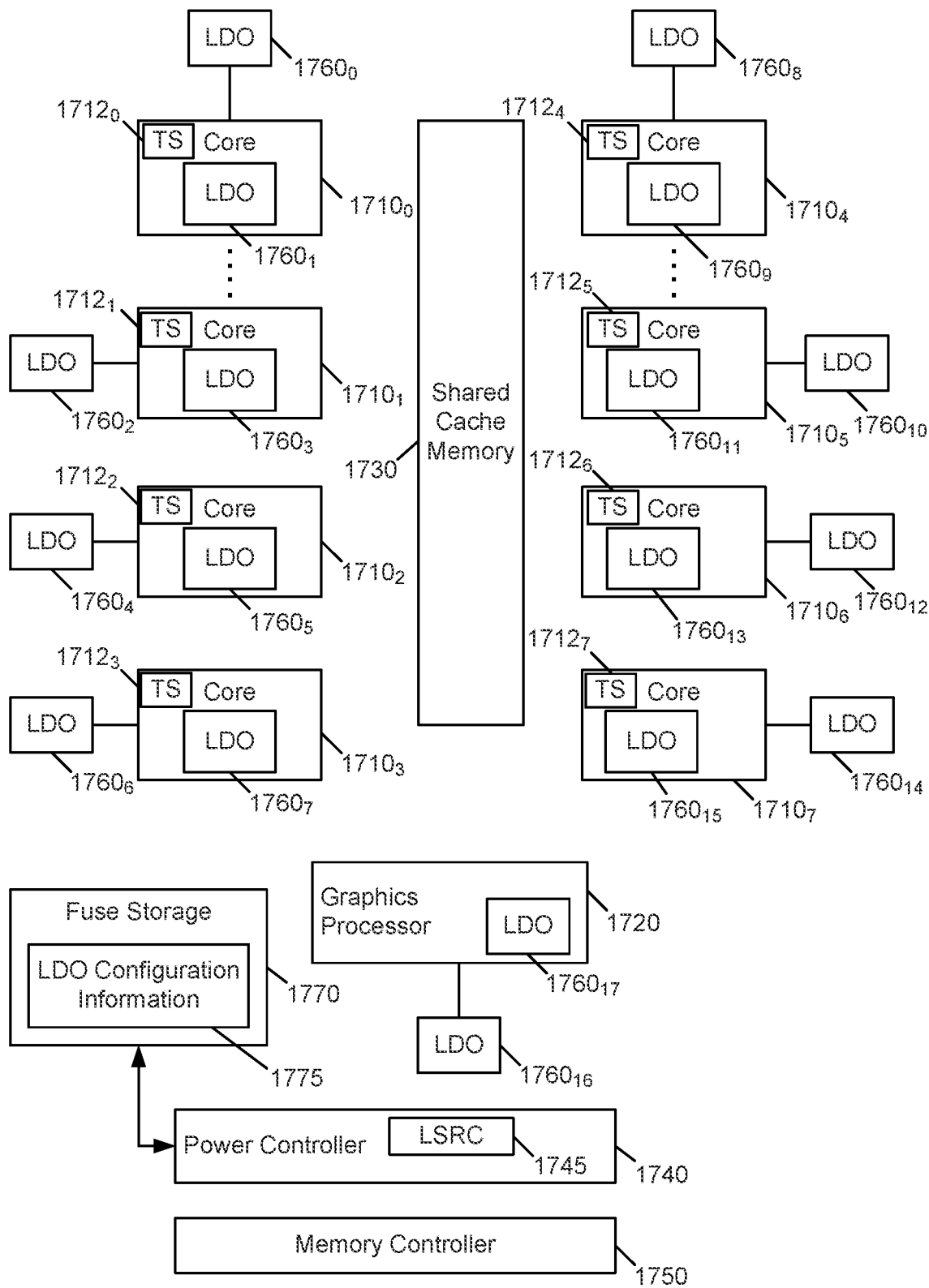
FIG. 17 is a block diagram of a high level view of a processor in accordance with an embodiment.

Referring now to FIG. 17, shown is a block diagram of a high level view of a processor in accordance with an embodiment. As shown in FIG. 17, processor 1700, which may be a multicore processor or other SoC, includes a plurality of cores $1710_0$-$1710_7$. Although shown with 8 cores in this embodiment, in different embodiments 4, 16, 32 or some other number of cores may be present. In addition, a graphics processor 1720 also is present. Although shown as a single unit, understand that graphics processor 1720 may include multiple independent graphics processing units (GPUs). As additionally shown, a shared cache memory 1730 may be shared by cores 1710 and graphics processor 1720.

In addition, processor 1700 also includes a power controller 1740 which may be used to provide overall power control for processor 1700. In embodiments herein, power controller 1740 may include a location selective regulator controller 1745, details of which will be described further herein. In addition, a memory controller 1750 may provide an interface between processor 1700 and a system memory, such as DRAM.

With further reference to FIG. 17, note that processor 1700 includes a plurality of LDOs $1760_0$-$1760_{17}$. In this implementation, the number of LDOs 1760 is oversubscribed with respect to the number of cores 1710 and graphics processor 1720. That is, processor 1700 is fabricated with more LDOs than corresponding processing units. In the particular implementation shown, cores 1710 and graphics processor 1720 each may include at least one LDO 1760. In addition, additional LDOs 1760 may be present externally to such processing units. These additional LDOs 1760 may, in some cases, act as auxiliary or substitute LDOs that may be controlled to provide power to one or more corresponding cores 1710 or other processing unit, depending upon configuration of the processor. Understand while in the embodiment of FIG. 17, each core or graphics processor is shown associated with two LDOs 1760 (one being internal to the corresponding processing unit and one external), embodiments are not limited in this regard and additional LDOs may be associated with particular cores or other processing units, such that possibly more than one LDO may be included within a given core and similarly more than one LDO may be externally located from a given core but associated with that core.

In an embodiment as in FIG. 17 with an oversubscribed number of voltage regulators, power controller 1740 and more specifically location selective regulator controller 1745 may access fuse information associated with the voltage regulators. As illustrated, processor 1700 may include a fuse storage 1770, e.g., implemented in a non-volatile memory that stores a variety of configuration information for processor 1700. Of interest herein, fuse storage 1770 includes LDO configuration information 1775. In an embodiment, LDO configuration information 1775 may store, e.g., a corresponding enable indicator or other information to identify, for each LDO, whether it is to be enabled or not. As such, in this static type of implementation, based on fuse information, certain LDOs 1760 may be statically disabled while others statically enabled. Such fuse information may be based on design time or post-manufacturing testing that identifies locations of likely thermal hot spots during operation. With this pre or post-silicon information, it may be used to cause certain LDOs 1760 to be enabled during operation while other such LDOs 1760 (e.g., associated with the identified likely hot spot regions) to be disabled. With LDOs as described herein in an oversubscription situation, the LDOs may be spaced throughout a processor, including internally to cores themselves, potentially with distributed power gates as described herein.

Further illustrated in FIG. 17, each core $1710_0$-$1710_7$ may include or be associated with at least one thermal sensor $1712_0$-$1712_7$. Understand that additional thermal sensors, which in an embodiment may be implemented as thermal diodes or other such mechanisms, may be provided throughout a layout of processor 1700 to sense and provide thermal information, e.g., to power controller 1740. Note that this thermal information may be used for various reasons, including the location selective control of LDOs as described herein. Also based on this thermal information, when it is determined that processor 1700 overall is operating at an excessive level, high level thermal regulation may be performed to protect the processor, e.g., by reducing operating voltage and/or frequency and/or shutting down subsystems or all of processor 1700. In addition, when thermal information is used as a predicate for activity information, power controller 1740 may control power regulation appropriately to deliver needed current for a given task. Still further, the thermal information may be provided to location selective regulator controller 1745 for use in performing dynamic control of LDO enabling/disabling as described herein.

In a particular embodiment, a small intellectual property (IP) block, e.g., a relatively small low power core or other processing unit may include or be associated with a single LDO. Larger higher power consuming cores (e.g., out-oforder cores) may be associated with two LDOs. And in embodiments providing for oversubscription, one or more additional or substitute LDOs may be associated with the various cores or other processing units. Of course greater or fewer numbers of LDOs may be included in or otherwise associated with particular cores in other embodiments.

Note further that although in the high level shown in FIG. 17, LDOs 1760 are generally shown as being symmetrically located with respect to cores 1710, such representation is for ease of illustration only. Instead, in many embodiments in which there are an oversubscribed number of LDOs, the LDOs may be asymmetrically located with regard to particular cores. Stated another way, the LDOs may be asymmetrically located throughout a semiconductor die to enable a selective one or more of the LDOs to provide power to corresponding cores and other processing units, either statically or dynamically in a manner to avoid or reduce hotspots.

In one embodiment, all of the components shown in FIG. 17 may be implemented on a single semiconductor die. In other cases, at least some of the LDOs may be implemented on another semiconductor die in a stacked die configuration. Further, while shown with a particular high level arrangement that provides for oversubscription of LDOs, other embodiments may enable location selective-based voltage regulator control even without oversubscription of voltage regulators.

Note that in the high level view of FIG. 17, only a limited number of components within processor 1700 are illustrated. It is to be understood that additional compute and other processing engines, including other compute components, physical unit (PHY) circuits, and other uncore circuitry may be present. As with the above discussion, such components may in certain embodiments be associated with multiple LDOs 1760, such that controllable power delivery to such components may occur as described herein. Understand while shown at this high level in the embodiment of FIG. 17, many variations and alternatives are possible.

Figure 18:
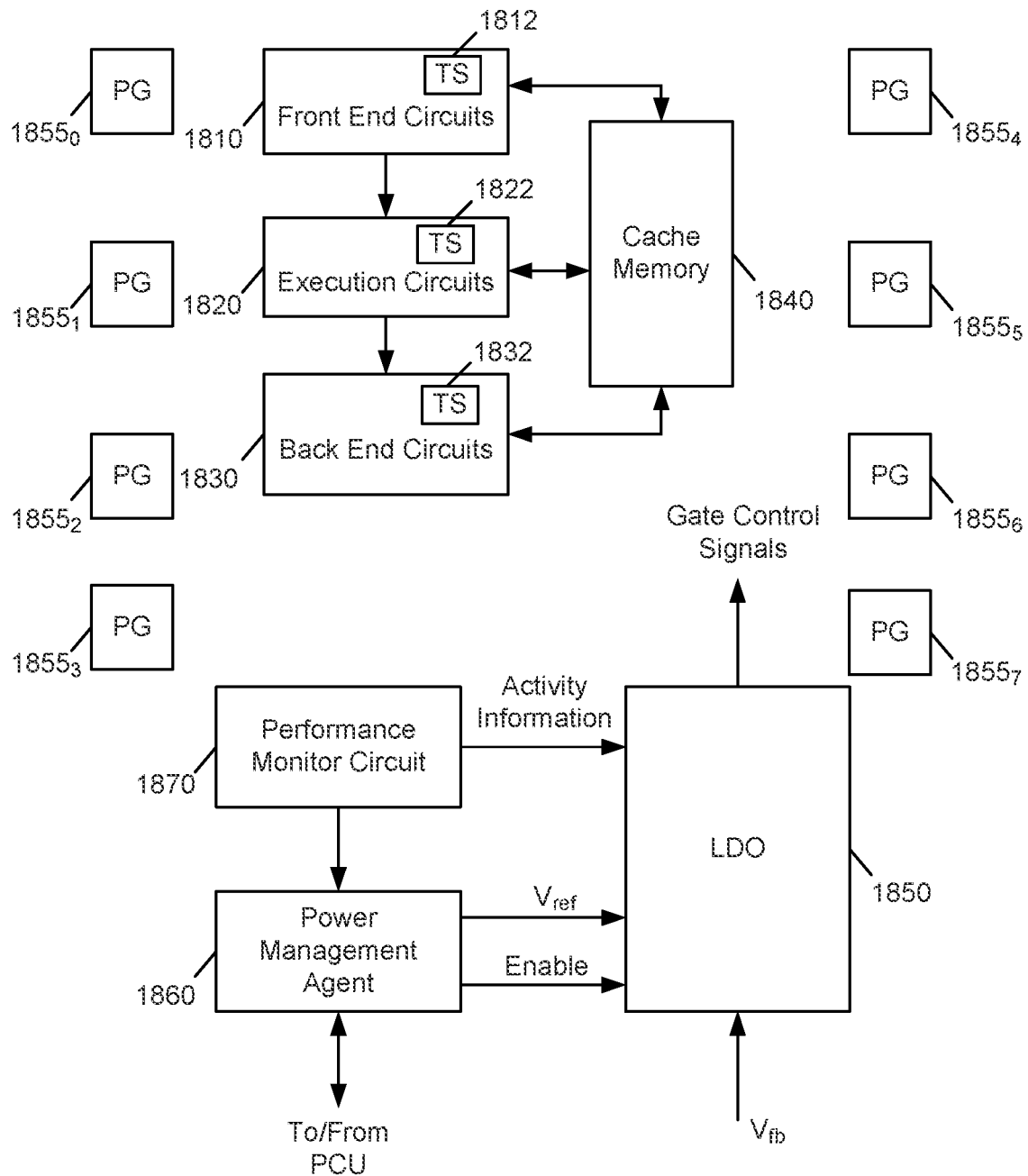
FIG. 18 is a block diagram of a core in accordance with an embodiment.

Referring now to FIG. 18, shown is a block diagram of a core in accordance with an embodiment. As shown in FIG. 18, core 1800 may be any type of processing core such as a given in-order or out-of-order processor. In the high level shown in FIG. 18, core 1800 includes front end circuits 1810, such as instruction fetch and decode units. In turn, front end unit circuits 1810 couple to a plurality of execution circuits 1820, which may execute instructions or other operations. In turn, results generated in execution circuits 1820 may be provided to back end circuits 1830 such as a retirement unit or so forth. As further shown, one or more cache memories 1840 may couple to the various circuits.

With regard to location-based selective power control as described herein, core 1800 further includes an LDO 1850. Note that LDO 1850 is configured to receive a reference voltage corresponding to regulated voltage level from a power management agent 1860. In turn, power management agent 1860 may be in communication with a PCU of the processor. In addition, power management agent 1860 may further receive performance monitoring information from a performance monitor circuit 1870. In embodiments herein, performance monitor circuit 1870 may maintain information regarding performance and activity within core 1800. For example, a variety of performance monitors or other activity counters may be provided to maintain information regarding activity within individual units within core 1800. In addition, performance monitor circuit 1870 may in some cases receive environmental information from sensors within core 1800, including thermal sensors such as thermal sensors 1812, 1822 and 1832. Based on this information, performance monitor circuit 1870 may provide an indication of activity levels of particular units within core 1800 both to power management agent 1860 and LDO 1850. In turn, this information may be used by various agents to control LDO 1850 and its associated power gate circuitry based thereon.

Based at least in part on this activity information, LDO 1850 may send gate control signals to its associated power gate modules $1855_0$-$1855_n$. Note that each power gate module 1855 may include one or more power gate circuits of LDO 1850. And as shown, these power gates may be distributed throughout an area of core 1800 so that their thermal effects also may be distributed. Further in embodiments herein, with fine granularity information as to activity levels that may exceed a given activity or thermal threshold, LDO 1850 may disable gate control signals to at least a subset of power gate modules 1855 that are more closely located with components of core 1850 undergoing a hot spot or other thermal condition can be disabled, to allow greater thermal dissipation. Understand while shown at this high level in the embodiment of FIG. 18, many variations and alternatives are possible.

Figure 19:
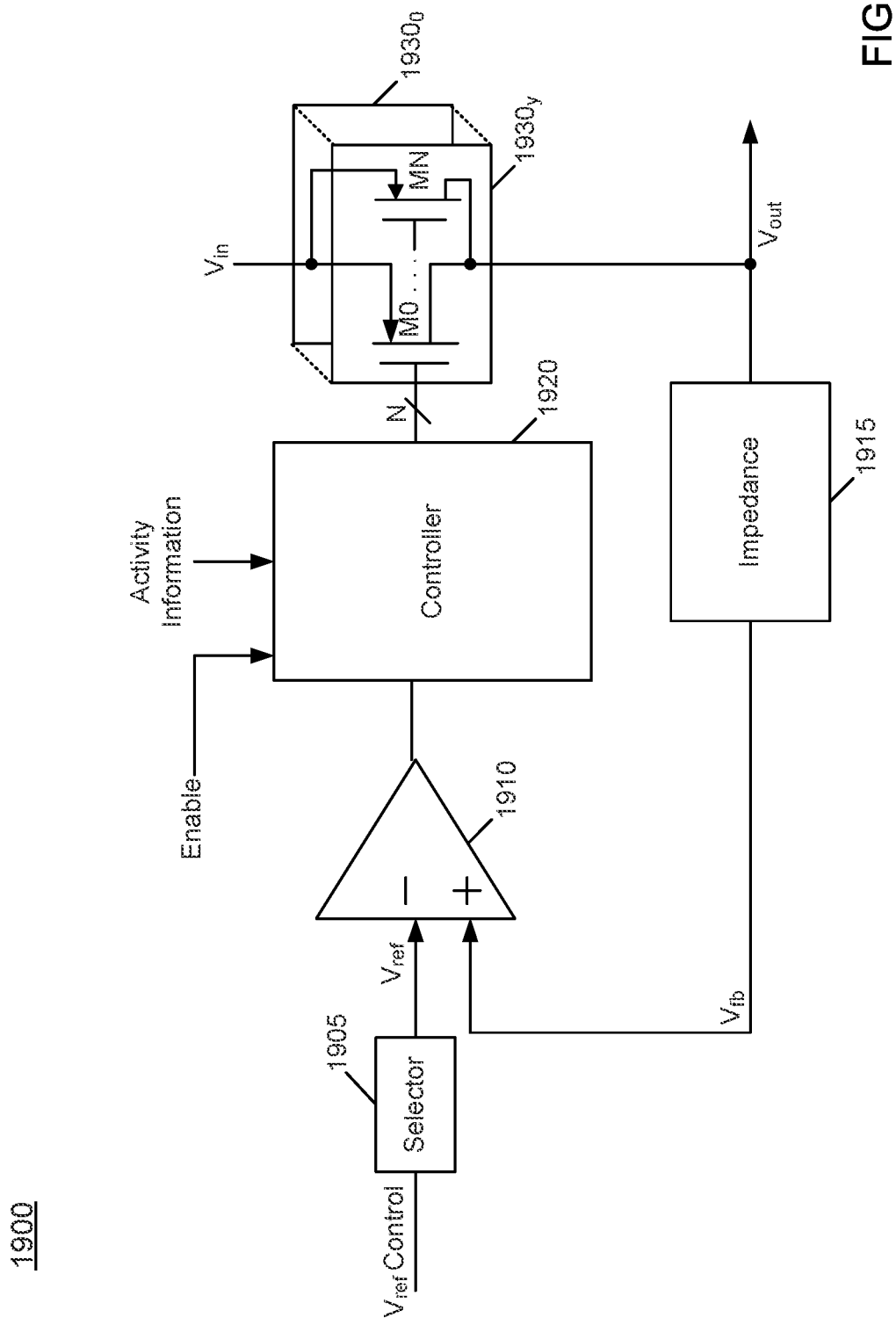
FIG. 19 is a schematic diagram of a LDO in accordance with an embodiment of the present invention.

Referring now to FIG. 19, shown is a schematic diagram of a LDO in accordance with an embodiment of the present invention. As shown in FIG. 19, LDO 1900 includes a comparator 1910 that compares a reference voltage (namely a target regulated voltage) to a feedback voltage, which may be received via an impedance 1915 (e.g., a voltage divider), such that the feedback voltage is based on the output voltage generated by LDO 1900. In an embodiment, comparator 1910 may be implemented with one or more analog-to-digital converters (ADCs) that receive the feedback voltage and one of a plurality of selected reference voltages, e.g., as selected by a selector 1905 based on a reference voltage control signal, which may be sent by a power controller, to indicate an appropriate voltage level at which the LDO is to operate.

As further illustrated, the output of comparator 1910 is provided to a controller 1920. In embodiments herein, controller 1920 may further receive an enable signal that enables the LDO for operation. Conversely, when the enable signal is disabled, LDO 1900 may, as a whole, be disabled. As further shown, controller 1920 may further receive activity information, such as thermal information to indicate a location of any hot spots within core 1800. As such, controller 1920 may, based at least in part on this information, selectively determine a number and location of corresponding power gate circuits to enable or disable. More specifically as shown in FIG. 19, a plurality of power gate modules $1930_0$-$1930_n$ are present. As illustrated, each power gate modules 1930 may include a plurality of metal oxide semiconductor field effect transistors (namely NMOSs M0-MN) that when enabled by gate control signals output an input voltage (e.g., received from an on-chip or off-chip voltage source) to provide an output voltage.

Note that in the implementation of FIG. 19, power gate circuitry is thus arranged as a plurality of power gate modules $1930_0$-$1930_y$. As shown, each power gate module 1930 may include multiple NMOSs M0-MN. To effect control of appropriate ones of these NMOS devices, controller 1920 may output an N-bit gate control signal to each of the plurality of power gate modules $1930_0$-$1930_y$. As one particular example, each power gate module 1930 may include five switching elements; of course, different numbers of individual switching elements per module may be realized.

In a representative example, each power gate module 1930 may provide a given total minimum resistance. In some cases, multiple power gate modules 1930 may be associated with each core. For example, in one embodiment each core may be associated with one or more LDOs each having at least two power gate modules 1930 to provide location selective control of power distribution. In another case, many more power gate modules 1930 may be provided per core. As one such example, 16 power gate modules 1930 may be provided per core. In such instance, each such power gate module 1930 may provide a total minimum resistance of approximately 8 milliohms. With such implementation, power gate modules 1930 may be distributed throughout a layout of a core to selectively control enabling/disabling of the power gates of respective power gate modules 1930, e.g., based on hot spot information of the core.

Thus in embodiments, each power gate module 1930 may be distributed within a different region of a given processing circuit. In some cases, individual power gates formed of corresponding NMOS switching devices also may be physically distributed, or all NMOSs of a given power gate module 1930 may be closely located to each other. Based on the activity information and appropriate enabling of thermal-based-control as described herein, each power gate module 1930 may be individually controlled, in which each of its multiple constituent individual power gates M0-MN can be individually controlled via a multi-bit gate control signal, provided to each of power gate module 1930. Note that each power gate module 1930 may be independently addressed by controller 1920. Understand while shown with this particular implementation in the embodiment of FIG. 19, many variations and alternatives are possible.

Figure 20:
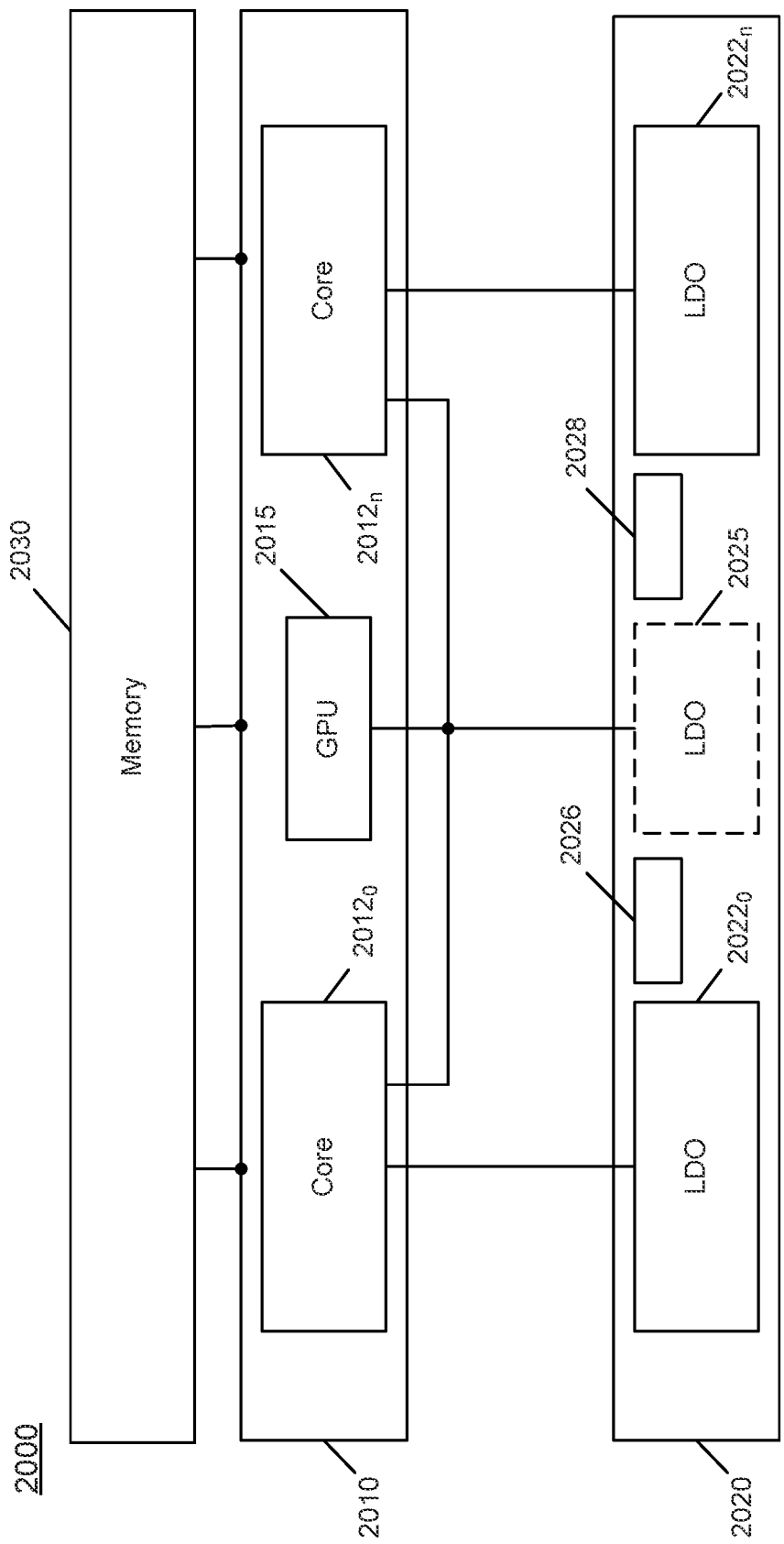
FIG. 20 is a cross-sectional view of a processor in accordance with an embodiment.

As discussed above, in some embodiments at least some of the voltage regulators may be adapted on a different semiconductor die than the cores or other processing units. Referring now to FIG. 20, shown is a cross-sectional view of a processor in accordance with an embodiment. As illustrated in FIG. 20, processor 2000, which may be a multicore processor or other SoC, includes multiple semiconductor die that are stacked together, namely a first semiconductor die 2010, a second semiconductor die 2020 and a third semiconductor die 2030. In the embodiment shown in FIG. 20, first semiconductor die 2010 may include a plurality of cores $2012_0$-$2012_n$. Although only two such cores are shown for ease of illustration, understand that many more cores, other processing units and additional circuitry may be present in a particular embodiment. As further shown, first semiconductor die 2010 also includes a GPU 2015.

In turn, second semiconductor die 2020 includes a plurality of LDOs $2022_0$-$2022_n$. Second die 2020 may further include additional components such as additional compute circuits, physical unit circuits and so forth. In a particular embodiment shown in FIG. 20, second semiconductor die 2020 includes at least one PHY circuit 2026 and at least one additional compute circuit 2028, which in an example may be a boot core (such as a microcontroller) to configure and bring up the system or a sensor hub to provide a fusion of environmental data such as gyroscopic information, compass information, barometer information, accelerometer information, GPS information, magnetic sensor information and so forth. Note that such circuitry and second semiconductor die 2020 overall may be the first die to power up and initialize activity, and may have capabilities to operate at lower power levels than first semiconductor die 2010. Note that multiple die influence the thermals of each other. If bottom die 2020 becomes hot, it will heat up die 2010 (and possibly die 2030) above, and vice versa. And of course this will change dynamically, depending the currently run workload.

Note that depending on implementation, one or more oversubscribed LDOs 2025 also may be present (shown in dashed form in FIG. 20). Whether or not an implementation provides for oversubscription, note that location selective control of LDOs 2022, 2025 may occur so that an LDO directly under a core 2012 having a hot spot may be controlled to be disabled or at least to have some number of its constituent power gates turned off. And further with an arrangement as in FIG. 20, when GPU 2015 is inactive, LDO 2025, which may provide primary power to GPU 2015, may provide additional current (or all required current) to one or more cores 2012. As further illustrated in FIG. 20, third semiconductor die 2030 may be a memory die which can be implemented as an example with DRAM or another memory topology such as a non-volatile dual inline memory module (NVDIMM).

Figure 21:
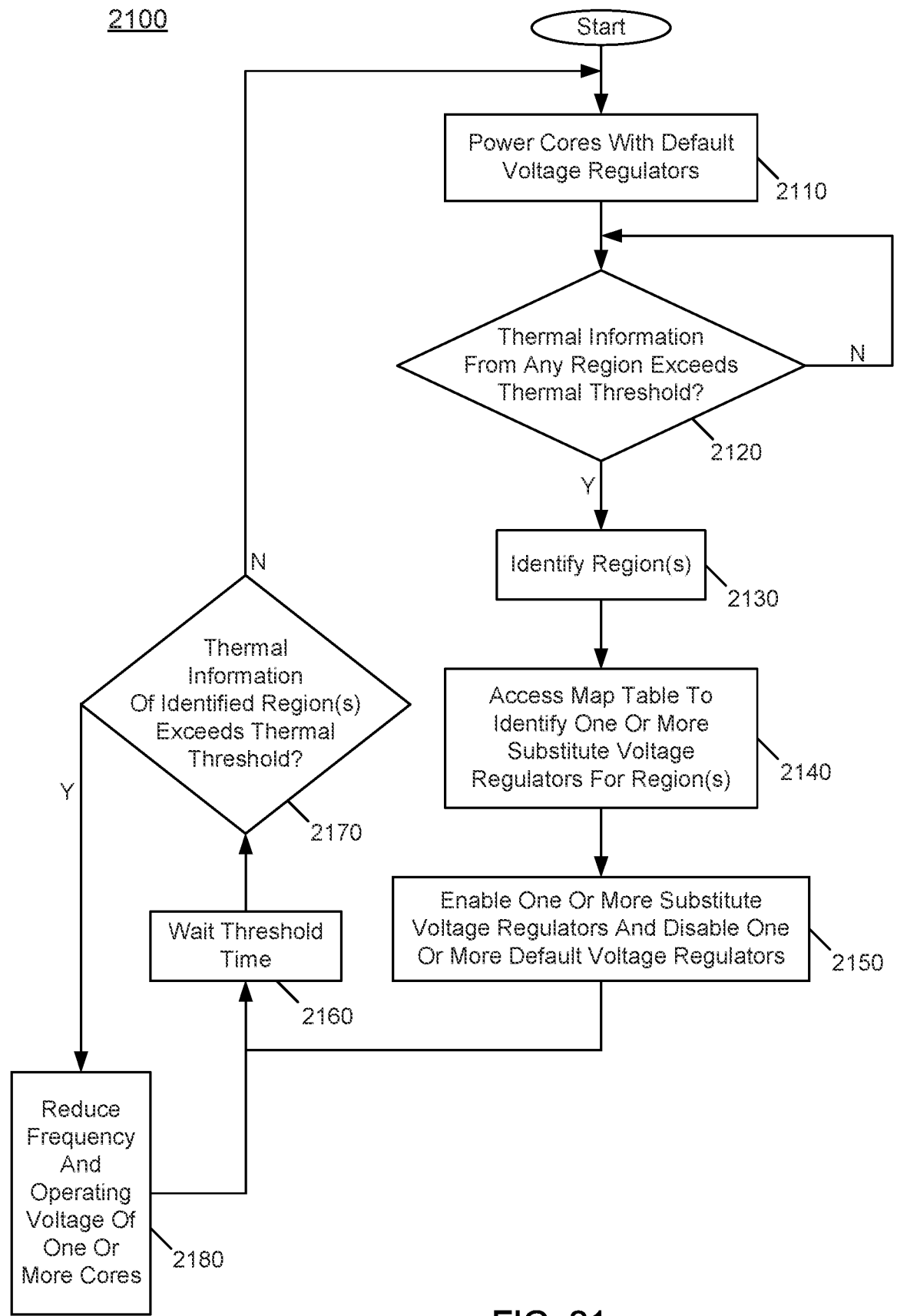
FIG. 21 is a flow diagram of a method in accordance with an embodiment of the present invention.

Referring now to FIG. 21, shown is a flow diagram of a method in accordance with an embodiment of the present invention. As shown in FIG. 21, method 2100 is a method for controlling voltage regulators of a processor or other SoC as described herein. As such, method 2100 may be performed by hardware circuitry, firmware, software and/or combinations thereof. In a particular embodiment, method 2100 may be performed by a location selective regulator controller which may be implemented, in an embodiment, within a power controller of a processor. As seen, method 2100 begins by powering cores with default voltage regulators (block 2110). Note that while FIG. 21 is in the context of a multicore processor, understand that in addition to or instead of cores, additional or different processing units may similarly be powered by one or more selected voltage regulators. In block 2110, such default voltage regulators may be a primary voltage regulator with which a given core is associated, e.g., in a map table that includes a plurality of entries each to identify at least one primary voltage regulator that is to provide a regulated voltage to a given core, as well as one or more secondary or substitute voltage regulators that optionally may provide some or all of a regulated voltage to a given core. In some cases this map table may be implemented within fuse storage or other non-volatile storage of the processor.

In any event, a processor may thus begin operation with power being provided to cores from default voltage regulators. In some cases there may be a 1:1 correspondence between a primary voltage regulator and a corresponding core. In other cases, multiple voltage regulators may act as a primary voltage regulator for a given core.

Next it is determined whether thermal information from any region of the processor exceeds a thermal threshold (diamond 2120). As an example, a processor die may be partitioned into a plurality of segments, e.g., quadrants, where each quadrant includes at least one core. Assume for purposes of discussion herein that a first region is operating at a temperature that exceeds this thermal threshold. As such, control next passes to block 2130 where this region may be identified. Then at block 2140 a map table may be accessed. More specifically, an entry of the map table associated with this region (or multiple such entries each associated with a core present in this region) may be used to identify one or more substitute voltage regulators for the region. Thereafter at block 2150 such substitute voltage regulators may be enabled to provide power to the core or cores present in this identified region having a hot spot. Note that in some cases, this substitute voltage regulator may provide some of the power to the core or cores of this region, and the primary voltage regulator may continue to provide some of the power, but with a reduced number of active power gates to reduce the thermal load. In other cases, the primary voltage regulator may be fully disabled to allow for greater thermal dissipation and temperature reduction.

Still with reference to FIG. 21, control next passes to block 2160 where a threshold time may then occur. Although embodiments are not limited in this regard as an example, this threshold time may be on the order of between tens of milliseconds and one or more seconds. Note that it is possible that power gates in a hot region are still used in reacting to a major transient (so the power gates are on for a few nanoseconds). When a controller determines the number of power gates to turn on, the ones in the hot region will be the last to be turned on. In the case where all FETs are on, the processor may limit such operation to less than a given duration, e.g., 10 milliseconds.

Such threshold time thus allows the potential for cooling of any identified hot spots. Next after this threshold time has completed, control passes to diamond 2170 where it may be determined whether thermal information of any identified region (previously having a hot spot) exceeds the thermal threshold. If so, control passes to block 2180 where a frequency reduction (and optionally a voltage reduction) of one or more cores, such as the cores associated with the identified region(s), may occur to reduce a performance state. As such, this parameter change and throttling of activity may enable sufficient reduction in temperature. As illustrated, after this change, control passes to block 2160, discussed above. Note of course that after the thermal issue is resolved, such throttle mechanisms may be removed, enabling the throttled cores or other circuitry to increase their performance state.

Otherwise if it is determined that as a result of this different configuration of power supply associations that temperature of the regions has reduced, control may pass back to block 2110, where a default configuration of voltage regulators to cores may again be applied. Of course such return to default configuration need not necessarily occur in all embodiments. Furthermore, understand that the arrangement in FIG. 21 may be used both in cases where there is an oversubscription of voltage regulators with respect to cores and cases where there are not extra voltage regulators. Nevertheless, even without oversubscription, the dynamic control described in FIG. 21 may be used to power given cores from a combination of voltage regulators and/or a controllable amount of power gates of a given one or more voltage regulator.

Also understand that while this embodiment describes an arrangement in which there is at least one core per quadrant, embodiments are not limited in this aspect. In other cases, one or more quadrants may include other circuitry instead of cores. For example, a given quadrant may include a high speed multi-physical unit (PHY) with a phase lock loop that may be provided with independent power control. And of course, any other type of IP circuit, such as a neural network or so forth may be present in a given quadrant in addition to or instead of one or more cores. Understand while shown at this high level in the embodiment of FIG. 21, many variations and alternatives are possible.

Figure 22:
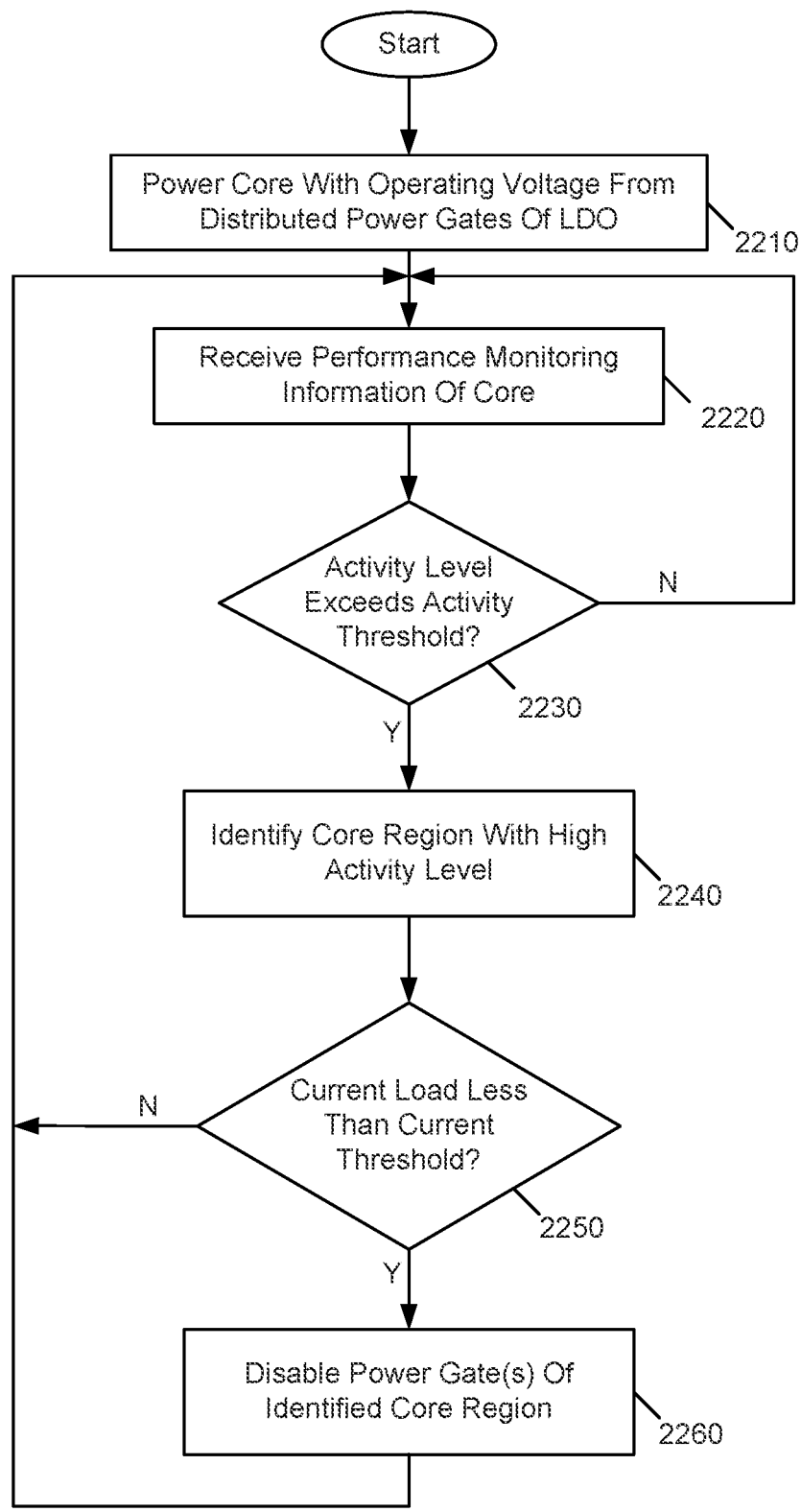
FIG. 22 is a flow diagram of a method in accordance with another embodiment of the present invention.

Referring now to FIG. 22, shown is a flow diagram of a method in accordance with another embodiment of the present invention. Specifically, method 2200 is a more particular method for controller at least one LDO associated with a core, at a regional granularity of the core. As such, method 2100 may be performed by hardware circuitry, firmware, software and/or combinations thereof. In a particular embodiment, method 2200 may be performed by control circuitry included in or associated with an LDO, and/or a local power controller such as a power management agent of a given core.

As illustrated, method 2200 begins by powering a core with an operating voltage from distributed power gates of at least one LDO (block 2210). Note that this LDO may be a locally present LDO, e.g., present within the circuitry of the core itself. Or it can be an LDO otherwise associated with the core, e.g., as present on the same semiconductor die as the core or on a separate core as described herein.

During operation, performance monitoring information of the core may be received (block 2220). In an embodiment, the core may include performance monitors as described herein, which may maintain information regarding activity of the core. Based at least in part on this information it may be determined at diamond 2230 whether the activity level exceeds an activity threshold. In some cases, performance monitoring information in the form of instructions per cycle or so forth may be considered with respect to an activity threshold, also in terms of instructions per cycle or so forth. In other cases, the activity level may correspond to temperature information associated with one or more temperature sensors of the core and the activity threshold may be a given temperature threshold.

In any case, if it is determined that the activity level exceeds an activity threshold control passes to block 2240 where a region of the core may be identified that is associated with this high activity level. For example, a core itself may be segmented into different regions and based on an activity of the different regions, a hot spot region within the core can be identified. Next, it is determined at diamond 2250 whether a current load is less than a current threshold. This current load may correspond to a given current level at which the core is operating. In some cases, this current level may in terms of a percentage of power gates to be enabled to provide sufficient power for a given current consumption level. For example, in some cases, this current level may in terms of a percentage of power gates to be enabled to provide sufficient power for a given current consumption level. For example, to operate a core at 10 amperes (A), approximately 10% of the power gates of a given LDO may be enabled. In almost all cases only a fraction of the power gates are enabled. Typically, an IP circuit runs at approximately half of its peak current. In a scenario where the IP circuit is running at 10 A and has a peak current of 20 A, 9% of the power gates (implemented as FETs) are enabled. Even at 18 A typical/20 A peak, only 50% of the power gates are on. Table 1 illustrates some examples.

TABLE 1

| Column | Calculation | | Example 1 | Example 1a: Changing operating current | Example 2: Changing Load line (LL) |
|---|---|---|---|---|---|
| A | | Minimum LDO resistance (mOhms) | 0.5 | 0.5 | 0.5 |
| B | | Total LL not including LDO (mOhms) | 4.5 | 4.5 | 9.5 |
| C | | Peak current | 20 | 20 | 20 |
| D | | typical current | 10 | 18 | 10 |
| E | C*(B + A) | Voltage drop at max current (mV) | 100 | 100 | 200 |
| F | (E − (B *D))/D | LDO Resistance needed to keep Voltage drop constant at typical current (mOhms) | 5.50 | 1.06 | 10.50 |
| G | min R/actual R | Percentage of LDOs on during typical currents | 9% | 47% | 5% |

As another representative example, assume an LDO is to operate with an input voltage of approximately 1.0 volts and to provide a regulated output voltage of approximately 0.9 volts. Further assume that the circuitry to be powered by this regulated voltage has a current consumption level of approximately 10 amperes. In this situation, a given percentage of power gates may be enabled to provide a total resistance of, e.g., 10 milliohms. Assume further that due to increased current consumption, e.g., as a result of increased activity such as enabling of additional core portions such as one or more vector execution units, the current consumption level increases to 20 amperes. In this situation, the resistance provided by the power gates may be dropped, e.g., to 5 milliohms to maintain the regulated output voltage at the requested level.

Still with reference to FIG. 22, in a particular embodiment, this current threshold may correspond to a level of approximately 80% of power gates being enabled. As an example, this current threshold may be set at a level of 80% of power gates being active. If lower than the threshold level of active power gates exists, one or more power gates of the identified region may be disabled (block 2260). That is, as the core is operating at a current load that can be handled with fewer power gates, one or more power gates in the identified region can be disabled, to reduce thermal load.

Otherwise, if the current load exceeds the current threshold, the previous voltage regulator settings, including a number of enabled power gates, may continue. This is the case, as it is likely that the high current demanded by the core is likely to only exist for thermally insignificant time durations (e.g., on the order of a few milliseconds). As such, the voltage regulator can continue to operate with its current configuration and not harm the processor. Understand while shown at this high level in the embodiment of FIG. 22, many variations and alternatives are possible.

The following examples pertain to further embodiments.

In one example, a processor comprises: a first plurality of IP circuits to execute operations; and a second plurality of integrated voltage regulators, where the second plurality of integrated voltage regulators are oversubscribed with respect to the first plurality of IP circuits.

In an example, the processor further comprises a fuse storage to store configuration information regarding the second plurality of integrated voltage regulators, the fuse storage to store a plurality of indicators, each to indicate whether a corresponding one of the second plurality of integrated voltage regulators is to be enabled.

In an example, one or more of the plurality of indicators is to indicate that a corresponding one of the second plurality of integrated voltage regulators is to be disabled based at least in part on post-silicon hot spot correlation information.

In an example, the processor further comprises a control circuit to receive the configuration information and disable at least in part one or more of the second plurality of integrated voltage regulators based at least in part thereon.

In an example, the processor comprises a first semiconductor die having the first plurality of IP circuits.

In an example, the first semiconductor die comprises a plurality of regions each including at least one of the first plurality of IP circuits, where when a temperature of a first region of the plurality of regions exceeds a thermal threshold, one or more of the second plurality of integrated voltage regulators associated with the first region are to be disabled.

In an example, the processor further comprises a second semiconductor die having the second plurality of integrated voltage regulators.

In an example, each of the second plurality of integrated voltages comprises a low drop out regulator including: a plurality of power gates to receive an input voltage and output a regulated voltage; and a controller to compare a feedback voltage of the regulated voltage to a reference voltage and send gate control signals to the plurality of power gates.

In an example, the controller is to receive activity information of at least a first IP circuit of the plurality of IP circuits and control a number of the plurality of power gates to be enabled based at least in part thereon.

In an example, the processor further comprises a control circuit to receive activity information of at least some of the first plurality of IP circuits and identify one or more of the second plurality of integrated voltage regulators to be disabled based at least in part thereon.

In an example, each of the first plurality of IP circuits is to couple to more than one of the second plurality of integrated voltage regulators.

In an example, the second plurality of integrated voltage regulators are asymmetrically located with regard to the first plurality of IP circuits.

In another example, a method comprises: causing a first integrated voltage regulator of a plurality of integrated voltage regulators of a processor to provide an operating voltage to a first core of a plurality of cores of the processor; and in response to determining that a temperature of a first region of the processor including the first core exceeds a temperature threshold, causing a second integrated voltage regulator to provide at least a portion of the operating voltage to the first core.

In an example, the method further comprises, in response to determining that the temperature of the first region exceeds the thermal threshold, accessing a table to identify the second integrated voltage regulator, the table including a plurality of entries each to identify a region of the processor and one or more of the plurality of integrated voltage regulators.

In an example, the method further comprises, in response to determining that the temperature of the first region exceeds the temperature threshold, causing the first integrated voltage regulator to be disabled.

In an example, the method further comprises, in response to determining that the temperature of the first region exceeds the thermal threshold: sending one or more first gate control signals to a first subset of power gates of the first integrated voltage regulator to cause the first subset of power gates of the first integrated voltage regulator to be disabled; and sending one or more second gate control signals to a second subset of power gates of the first integrated voltage regulator to cause the second subset of power gates of the first integrated voltage regulator to be enabled.

In an example, the method further comprises, in response to determining that the temperature of the first region exceeds a second thermal threshold, the second thermal threshold less than the first thermal threshold, reducing a number of active power gates of the first integrated voltage regulator. In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In yet another example, a system comprises: a processor having a plurality of cores and a plurality of low dropout regulators to power the plurality of cores, where a first low dropout regulator of the plurality of low dropout regulators comprises a plurality of power gates, where when a hot spot region is identified within a first core associated with the first low dropout regulator, at least some of the plurality of power gates of the first low dropout regulator are to be disabled; and a system memory coupled to the processor.

In an example, when an activity level of a first portion of the first core exceeds a threshold, one or more of the plurality of power gates of the first low dropout regulator located in the first portion of the first core are disabled.

In an example, the processor further comprises a fuse storage to store configuration information regarding the plurality of low dropout regulators, the fuse storage to store a plurality of indicators, each to indicate whether a corresponding one of the plurality of low dropout regulators is to be enabled, where the plurality of low dropout regulators are oversubscribed with respect to the plurality of cores.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:
1. A processor, comprising:
a plurality of circuits;
a plurality of integrated voltage regulators (IVRs) to power the plurality of circuits, wherein a number of the plurality of IVRs is greater than a number of the plurality of circuits, a first IVR of the plurality of IVRs comprises a plurality of power gates, and when a hot spot region is identified within a first circuit associated with the first IVR, at least some of the plurality of power gates of the first IVR are to be disabled; and a non-volatile fuse storage to store respective indicators to indicate whether respective IVRs of the plurality of IVRs are to be enabled or disabled based on whether the respective IVRs are associated with a potential hot spot in the processor; wherein:

the respective indicators are to indicate that at least one IVR of the plurality of IVRs is to be disabled; and when a temperature of a first region of the processor exceeds a thermal threshold: one or more of the plurality of IVRs associated with the first region are to be disabled, and one or more others of the plurality of IVRs located in a different region of the processor are to provide power to the first region.

2. The processor of claim 1, further comprising a control circuit to partly disable at least one IVR of the plurality of IVRs which is associated with the potential hot spot based on the respective indicators by disabling a number of power gates of a plurality of power gates of the at least one of the plurality of IVRs.

3. The processor of claim 1, wherein at least one of the plurality of IVRs is to be statically disabled based on a priori information.

4. The processor of claim 1, wherein the plurality of circuits comprise a plurality of cores and at least one graphics processor.

5. The processor of claim 1, wherein a circuit of the plurality of circuits is associated with at least first and second IVRs, and the respective indicators are to indicate that whichever of the first and second IVRs is closer to the potential hot spot is to be disabled and whichever of the first and second IVRs is further from the potential hot spot is to be enabled.

6. The processor of claim 1, wherein a location of the potential hot spot is identified by at least one of post-manufacturing testing of the processor or information obtained prior to manufacture of the processor.

7. The processor of claim 1, further comprising one or more thermal sensors to identify the potential hot spot.

8. The processor of claim 1, further comprising a power controller coupled to the non-volatile fuse storage, wherein the power controller is configured to substitute a first IVR of the plurality of IVRs in place of a second IVR of the plurality of IVRs to provide power to one of the plurality of circuits based on a location of the potential hot spot.

9. The processor of claim 8, wherein the first IVR is further than the second IVR from the hot spot.

10. A system comprising:

a processor comprising a plurality of cores, a plurality of low dropout regulators to power the plurality of cores, and a plurality of thermal sensors, wherein a first low dropout regulator of the plurality of low dropout regulators comprises a plurality of power gates, and when a hot spot region is identified within a first core associated with the first low dropout regulator, at least some of the plurality of power gates of the first low dropout regulator are to be disabled; and a non-volatile fuse storage to store configuration information regarding the plurality of low dropout regulators, wherein:

the configuration information comprises a respective indicators to indicate whether respective low dropout regulators of the plurality of low dropout regulators are to be enabled or disabled;

the plurality of low dropout regulators are oversubscribed with respect to the plurality of cores;

the respective indicators are to indicate that at least one low dropout regulator of the plurality of low dropout regulators is to be disabled; and when a temperature of a first region of the processor exceeds a thermal threshold: one or more of the plurality of low dropout regulators associated with the first region are to be disabled, and one or more others of the plurality of low dropout regulators located in a different region of the processor are to provide power to the first region.

11. The system of claim 10, wherein when an activity level of a first portion of the first core exceeds a threshold, one or more of the plurality of power gates of the first low dropout regulator located in the first portion of the first core are disabled.

12. The system of claim 10, wherein the processor further comprises a controller to receive activity information of a second core and identify one or more of the plurality of low dropout regulators to be disabled based at least in part on the activity information.

13. The system of claim 12, wherein the controller is to further control a number of power gates of the plurality of power gates of a second low dropout regulator, the second low dropout regulator to provide a voltage to the first core.

14. The system of claim 10, wherein one or more thermal sensors of the plurality of thermal sensors are configured to identify the hot spot region.

15. A processor, comprising:

a semiconductor die having a plurality of cores to execute operations and at least one graphics processor;

a shared cache memory coupled to the plurality of cores and the at least one graphics processor;

a plurality of integrated voltage regulators (IVRs) associated with the plurality of cores and the at least one graphics processor, wherein the semiconductor die comprises a plurality of regions, each region of the plurality of regions includes at least one core of the plurality of cores, the at least one graphics processor is located in a first region of the plurality of regions, the first region has a smaller number of the IVRs of the plurality of IVRs than at least one other region of the plurality of regions, a first IVR of the plurality of IVRs comprises a plurality of power gates, and when a hot spot region is identified within a first core associated with the first IVR, at least some of the plurality of power gates of the first IVR are to be disabled; and a non-volatile fuse storage configured to store configuration information to indicate whether respective IVRs of the plurality of IVRs are to be enabled or disabled based on whether the respective IVRs are associated with a potential hot spot in the processor; wherein:

the plurality of IVRs are oversubscribed with respect to the plurality of cores;

the configuration information indicates that at least one IVR of the plurality of IVRs is to be disabled; and when a temperature of a first region of the processor exceeds a thermal threshold: one or more of the plurality of IVRs associated with the first region are to be disabled, and one or more others of the plurality of IVRs located in a different region of the processor are to provide power to the first region.

16. The processor of claim 15, further comprising:
a first semiconductor die comprising the plurality of cores; and
a second semiconductor die comprising at least some of the plurality of IVRs, wherein the second semiconductor die is stacked with respect to the first semiconductor die.

17. The processor of claim 15, wherein a first core of the plurality of cores comprises at least one IVR of the plurality of IVRs, and the at least one IVR of the plurality of IVRs comprises a low dropout regulator.

18. The processor of claim 15, wherein:
the at least one IVR comprises a plurality of power gates; and
the configuration information indicates that, to disable the at least one IVR, a number of power gates of the plurality of power gates of the at least one IVR are to be disabled.

* * * * *